(12) United States Patent
Matsushita et al.

(10) Patent No.: US 6,852,194 B2
(45) Date of Patent: Feb. 8, 2005

(54) PROCESSING APPARATUS, TRANSFERRING APPARATUS AND TRANSFERRING METHOD

(75) Inventors: Minoru Matsushita, Minato-ku (JP); Yasushi Kodashima, Minato-ku (JP); Toshikazu Kumai, Minato-ku (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/147,990

(22) Filed: May 20, 2002

(65) Prior Publication Data

US 2002/0170671 A1 Nov. 21, 2002

(30) Foreign Application Priority Data

May 21, 2001 (JP) .................................. P2001-151640

(51) Int. Cl.[7] .......................... C23F 1/00; C23C 16/00
(52) U.S. Cl. .......................... 156/345.32; 156/345.31; 118/719; 414/217; 414/939; 204/298.25; 204/298.35
(58) Field of Search ..................... 204/298.25, 298.35; 118/719; 156/345.31, 345.32; 414/939

(56) References Cited

U.S. PATENT DOCUMENTS

| | | | | |
|---|---|---|---|---|
| 5,002,010 A | * | 3/1991 | Weinberg | 118/719 |
| 5,186,718 A | * | 2/1993 | Tepman et al. | 29/25.01 |
| 5,286,296 A | * | 2/1994 | Sato et al. | 118/719 |
| 5,310,410 A | * | 5/1994 | Begin et al. | 29/25.01 |
| 5,695,564 A | * | 12/1997 | Imahashi | 118/719 |
| 5,788,447 A | * | 8/1998 | Yonemitsu et al. | 414/217 |
| 5,855,681 A | * | 1/1999 | Maydan et al. | 118/719 |
| 6,017,820 A | * | 1/2000 | Ting et al. | 438/689 |
| 6,071,055 A | * | 6/2000 | Tepman | 414/217 |
| 6,217,663 B1 | * | 4/2001 | Inokuchi et al. | 118/728 |
| 6,257,827 B1 | * | 7/2001 | Hendrickson et al. | 414/805 |
| 6,403,924 B1 | * | 6/2002 | Hayashi | 219/390 |
| 6,440,261 B1 | * | 8/2002 | Tepman et al. | 118/715 |
| 6,503,365 B1 | * | 1/2003 | Kim et al. | 156/345.32 |
| 2002/0061248 A1 | * | 5/2002 | Tepman | 414/744.5 |
| 2002/0134506 A1 | * | 9/2002 | Franklin et al. | 156/345.31 |

* cited by examiner

*Primary Examiner*—Parviz Hassanzadeh
*Assistant Examiner*—Karla Moore
(74) *Attorney, Agent, or Firm*—Pillsbury Winthrop LLP

(57) ABSTRACT

Processing apparatus is disclosed, that comprises substrate container holding table that can hold substrate container that contains plurality of target substrates, first transferring chamber, disposed adjacent to the substrate container holding table, that maintains the interior at first pressure, first processing unit group, disposed around the first transferring chamber, that processes target substrate at the first pressure, first transferring mechanism, disposed in the first transferring chamber, that transfers target substrate, second transferring chamber, disposed adjacent to the first transferring chamber, that maintains the interior at second pressure, second processing unit group, disposed around the second transferring chamber, that processes target substrate at the second pressure, and second transferring mechanism, disposed in the second transferring chamber, wherein the first transferring mechanism and/or the second transferring mechanism has at least two transferring arms.

18 Claims, 27 Drawing Sheets

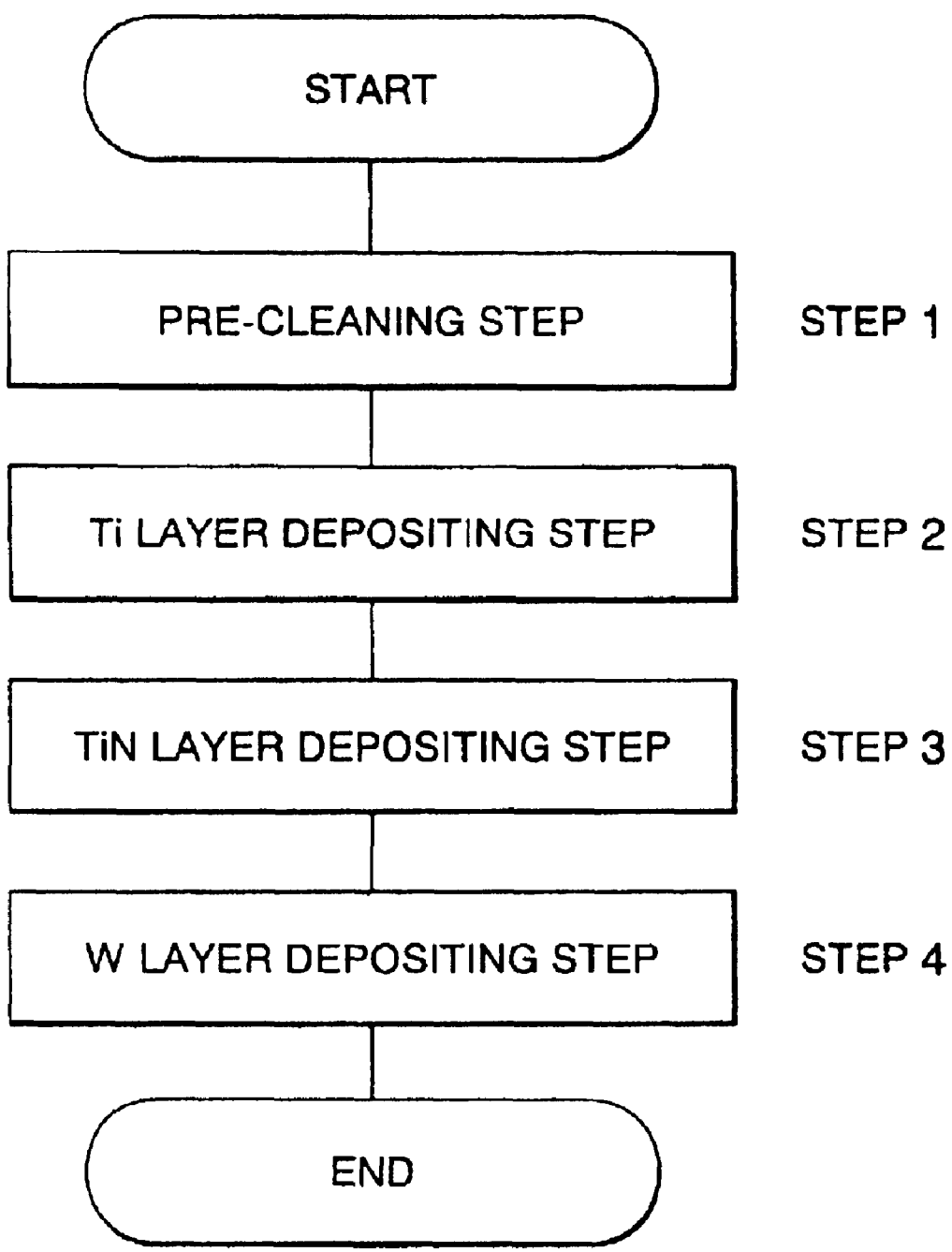

PROCESSING APPARATUS, TRANSFERRING APPARATUS AND TRANSFERRING METHOD

BACKGROUND OF THE INVENTION

1. Field of the Invention

The present invention relates to a processing apparatus, which processes a target substrate such as a silicon wafer used as a material of a semiconductor device, and a transferring apparatus and a transferring method used for the processing apparatus, in particular, to the processing apparatus that deposits various types of films on the front surface of a target substrate and the transferring apparatus and the transferring method used for the processing apparatus that deposits various types of films on the front surface of a target substrate.

2. Description of the Related Art

In a fabricating method for a semiconductor device that has been widely and conventionally used, various types of thin films such as an oxide film, a nitride film, and a nitrogen oxide film are deposited in a predetermined sectional shape on the front surface of a silicon wafer (that is hereinafter simply referred to as "wafer"). Such various types of thin films are deposited by for example a CVD (Chemical Vapor Deposition) unit. As a method for laminating a plurality of thin films on a wafer, a so-called multi-chamber type fabricating apparatus is known. In the multi-chamber type fabricating apparatus, a plurality of CVD units are connected with a single transferring chamber. FIG. 28 is a plan view showing an outlined structure of a typical multi-chamber type processing apparatus 300.

In the multi-chamber type processing apparatus 300, a plurality of processing units 310 to 315 that deposit respective thin films are radially disposed on the outer periphery of a transferring chamber 301 disposed nearly at the center of the apparatus 300. Transferring arms 303 and 304 are disposed in the transferring chamber 301. After a carrier cassette C that contains a plurality of untreated wafers W is placed on a holding table 305, the processing apparatus 300 is activated. First of all, a sub arm 306 takes out a wafer W from the carrier cassette C and temporarily places the wafer W in a load lock chamber 307. Thereafter, the transferring arm 303 is operated to take out the wafer W from the load lock chamber 307 and convey the wafer W to the transferring chamber 301. The transferring arm 303 loads and unloads the wafer W between each of the processing units 310 to 315 and the transferring chamber 301 in a predetermined sequence so that a plurality of thin films are deposited on the wafer W.

In recent semiconductor apparatuses, there are needs to increase the number of films to be deposited and to decrease the thickness thereof. However, when the number of thin films is increased, the forgoing six-chamber type processing apparatus 300 that has six processing units cannot deposit all the desired thin films. To solve such a problem, a plurality of six-chamber type processing apparatuses such as multi-chamber type processing apparatuses 300 are disposed. In this case, after films are deposited on a wafer w by one processing apparatus, the wafer W is removed therefrom and conveyed to the adjacent processing apparatus in which other films are deposited on the wafer W.

However, when a wafer W on which a thin film is being deposited in a process atmosphere is exposed to outer air, an oxide film is formed on the front surface of the wafer W. Thus, a step that removes the oxide film is additionally required. In other words, the fabrication efficiency deteriorates. In addition, since thinner films are required, when a wafer W is taken out from a process atmosphere, a thin film deposited on the front surface of the wafer W deteriorates. As a result, the quality of the semiconductor device as a final product deteriorates. In addition, when two multi-chamber type processing apparatus 300 are disposed, the installation area (the footprint) becomes large. As a result, the facility cost and the fabrication cost of the final product rise.

SUMMARY OF THE INVENTION

The present invention is made for solving the forgoing existing problems. In other words, the present invention is to provide a processing apparatus that can fabricate a semiconductor device with a high process efficiency and high quality and a transferring apparatus and a transferring method that are used for the processing apparatus.

A first aspect of the present invention is a processing apparatus, comprising a substrate container holding table that can hold a substrate container that contains a plurality of target substrates, a first transferring chamber that is disposed adjacent to the substrate container holding table and that maintains the interior at a first pressure, a first processing unit group disposed around the first transferring chamber and that processes a target substrate at the first pressure, a first transferring mechanism that is disposed in the first transferring chamber and that transfers a target substrate, a second transferring chamber that is disposed adjacent to the first transferring chamber and that maintains the interior at a second pressure, a second processing unit group that is disposed around the second transferring chamber and that processes a target substrate at the second pressure, and a second transferring mechanism disposed in the second transferring chamber, wherein the first transferring mechanism and/or the second transferring mechanism has at least two transferring arms.

A second aspect of the present invention is a processing apparatus, comprising a substrate container holding table that holds a substrate container that contains a plurality of target substrates, a transferring chamber that is disposed adjacent to the substrate container holding table and that maintains the interior at a predetermined pressure, at least two processing units that are disposed around the transferring chamber, that process a target substrate at the predetermined pressure, and that are selected from the group consisting of a titanium nitride layer depositing unit, a tantalum nitride layer depositing unit, and a tungsten nitride layer depositing unit, at least two titanium layer depositing units that are disposed around the transferring chamber and that process a target substrate at the predetermined pressure, at least two tungsten layer depositing units that are disposed around the transferring chamber and that process a target substrate at the predetermined pressure, at least one pre-cleaning unit that is disposed around the transferring chamber and that processes a target substrate at the predetermined pressure, and at least three transferring arms that are disposed in the transferring chamber and that transfer a target substrate.

A thrid aspect of the present invention is a processing apparatus, comprising a substrate container holding table that holds a substrate container that contains a plurality of target substrates, a transferring chamber that is disposed adjacent to the substrate container holding table and that maintains the interior at a predetermined pressure, at least two units that are disposed around the transferring chamber, that process a target substrate at the predetermined pressure, and that are selected from the group consisting of a titanium nitride layer depositing unit, a tantalum nitride layer depositing unit, and a tungsten nitride layer depositing unit, at least two tantalum layer depositing units that are disposed around the transferring chamber and that process a target substrate at the predetermined pressure, at least two copper layer depositing units that are disposed around the transferring chamber and that process a target substrate at the predetermined pressure, at least one pre-cleaning unit that is disposed around the transferring chamber and that processes a target substrate at the predetermined pressure, and at least three transferring arms that are disposed in the transferring chamber and that transfer a target substrate.

A fourth aspect of the present invention is a processing apparatus, comprising a substrate container holding table that holds a substrate container that contains a plurality of target substrates, a transferring chamber that is disposed adjacent to the substrate container holding table and that maintains the interior at a predetermined pressure, a processing unit that is disposed around the transferring chamber, that processes a target substrate at the predetermined pressure, and that is selected from the group consisting of a pre-cleaning unit, an alumina layer depositing unit, a zirconium oxide layer depositing unit, a zirconium silicate layer depositing unit, a hafnium oxide layer depositing unit, a hafnium silicate layer depositing unit, an yttrium oxide layer depositing unit, an yttrium silicate layer depositing unit, a lanthanum oxide layer depositing unit, a lanthanum silicate layer depositing unit, an oxide layer forming unit, a nitride layer forming unit, a manganese layer depositing unit, a niobium layer depositing unit, an aluminum layer depositing unit, a molybdenum layer depositing unit, a zirconium layer depositing unit, a vanadium layer depositing unit, a cobalt layer depositing unit, a rhenium layer depositing unit, an iridium layer depositing unit, a platinum layer depositing unit, a ruthenium oxide layer depositing unit, an annealing unit, and a tungsten layer depositing unit, and at least three transferring arms that are disposed in the transferring chamber and that transfer a target substrate.

According to the present invention, since many processing units are disposed around a transferring chamber, a processing apparatus that can process a wafer W at an improved speed can be provided. In addition, processes that require different pressure environments can be successively performed through the transferring chamber. Thus, since it is not necessary to expose a target substrate to outer air, the target substrate can be processed in high quality.

A fifth aspect of the present invention is a transferring apparatus, comprising an arm that can be expanded, contracted, and swiveled, and a target substrate holding member that is disposed on the forward end side of the arm and that has a shape asymmetrical to the direction in which the arm is expanded and contracted.

According to the present invention, with the processing apparatus, a target substrate can be directly transferred between transferring units. As a result, the process efficiency of the processing apparatus can be improved.

A sixth aspect of the present invention is a transferring method of two transferring arms that can be expanded, contracted, and swiveled and that are adjacently disposed, each of the transferring arms having a target substrate holding member, the target substrate holding member having a concave portion and a convex portion facing the other transferring arm, the method comprising causing the target substrate holding member of the first transferring arm to be expanded toward nearly the center of the swiveling of the second transferring arm and the target substrate holding member of the second transferring arm to be expanded toward a direction deviating from the center of the swiveling of the first transferring arm so that the concave portion and the convex portion of the target substrate holding member of the first transferring arm face the convex portion and the concave portion of the target substrate holding member of the second transferring arm, respectively, and transferring the target substrate between the first transferring arm and the second transferring arm.

A seventh aspect of the present invention is a transferring method of two transferring arms that can be expanded, contracted, and swiveled and that are adjacently disposed, each of the transferring arms having a target substrate holding member, the target substrate holding member having a concave portion and a convex portion facing the other transferring arm, the method comprising causing the target substrate holding member of the first transferring arm to be expanded toward a direction deviating from the center of the swiveling of the second transferring arm and the target substrate holding member of the second transferring arm to be expanded toward a direction deviating from the center of the swiveling of the first transferring arm so that the concave portion and the convex portion of the target substrate holding member of the first transferring arm face the convex portion and the concave portion of the target substrate holding member of the second transferring arm, respectively, and transferring the target substrate between the first transferring arm and the second transferring arm.

According to the present invention, a target substrate can be directly transferred between transferring units. Thus, the process efficient of the processing apparatus can be improved.

In the specification of the present patent application, unless otherwise specified, "processing units" include those that not only physically and/or chemically react to a target substrate, but measure and/or inspect the film quality, film thickness, and particles of the target substrate.

BRIEF DESCRIPTION OF THE DRAWINGS

The present invention is described referring to the accompanying drawings, and it is to be understood that such drawings are offered for the purpose of illustration only and do not limit the invention in any case.

FIG. 5 is a flow chart for which the processing apparatus according to the first embodiment of the present invention fabricates a semiconductor device.

DETAILED DESCRIPTION OF THE INVENTION

Explanation of Embodiments

Figure 1:
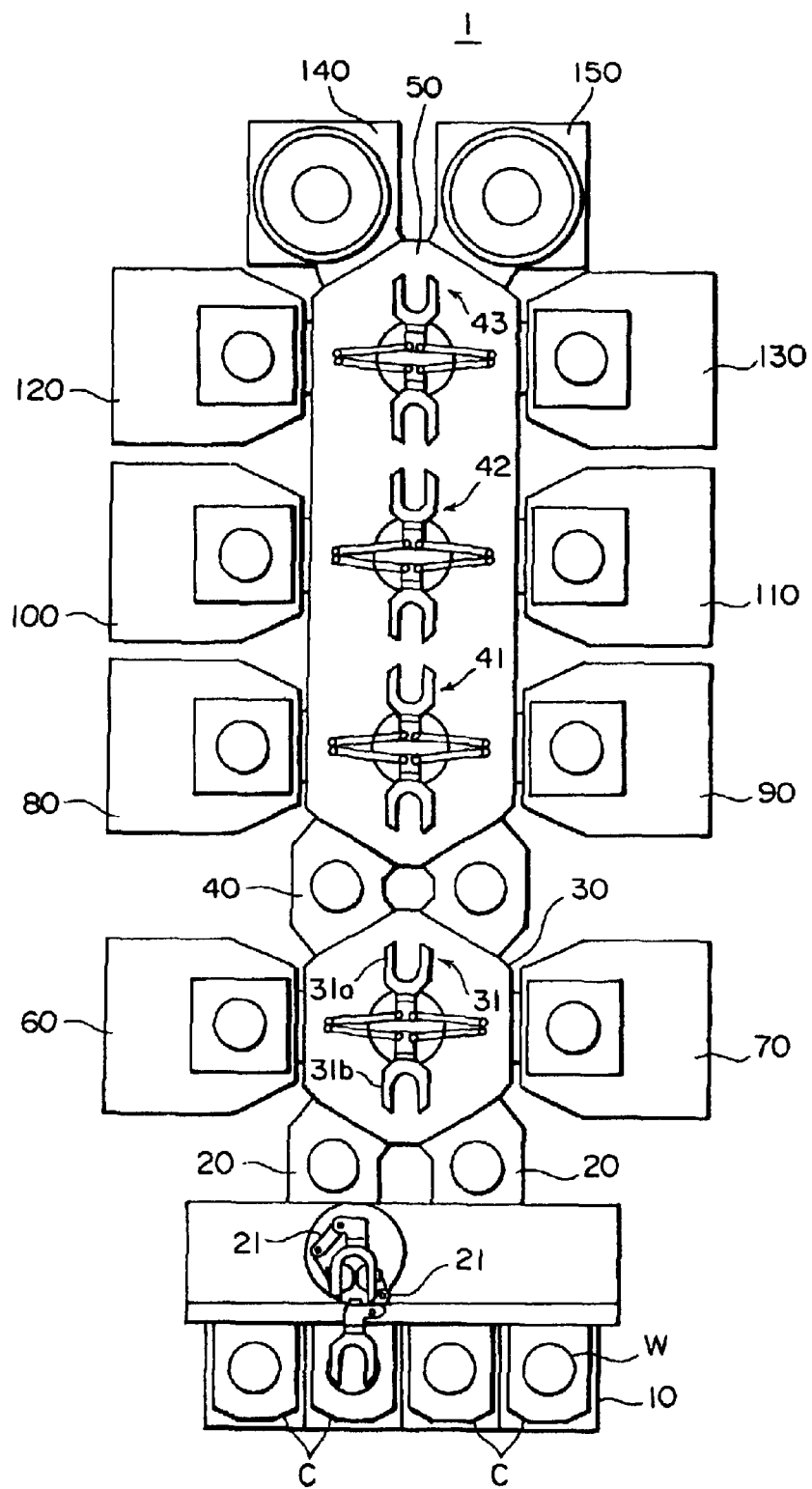
FIG. 1 is a plan view showing a processing apparatus according to a first embodiment of the present invention.

According to the present invention, since a plurality of processing units are disposed around a transferring chamber, a processing apparatus that has a high process speed and a high area efficiency can be provided. In addition, a processing unit group is divided into a plurality of processing spaces corresponding to processing environments. The processing unit group is connected as one processing apparatus. As a result, a semiconductor device can be fabricated with improved process efficiency and high quality.

According to an implementation mode of the present invention, the first processing unit group or the second processing unit group is composed of at least one processing unit selected from the group consisting of a supercritical cleaning unit, a reactive ion etching unit, and a spatter etching unit.

According to an implementation mode of the present invention, the first processing unit group or the second processing unit group is composed of at least one unit selected from the group consisting of a titanium layer depositing unit, a titanium nitride layer depositing unit, a tungsten layer depositing unit, a tantalum layer depositing unit, a tantalum nitride layer depositing unit, a tungsten nitride layer depositing unit, a copper layer depositing unit, an alumina layer depositing unit, a zirconium oxide layer depositing unit, a zirconium silicate layer depositing unit, a hafnium oxide layer depositing unit, a hafnium silicate layer depositing unit, an yttrium oxide layer depositing unit, an yttrium silicate layer depositing unit, a lanthanum oxide layer depositing unit, a lanthanum silicate layer depositing unit, an oxide layer forming unit, a nitride layer forming unit, a manganese layer depositing unit, a niobium layer depositing unit, an aluminum layer depositing unit, a molybdenum layer depositing unit, a zirconium layer depositing unit, a vanadium layer depositing unit, a cobalt layer depositing unit, a rhenium layer depositing unit, an iridium layer depositing unit, a platinum layer depositing unit, a ruthenium oxide layer depositing unit, and an annealing unit.

According to an implementation mode of the present invention, the first pressure is different from the second pressure.

According to an implementation mode of the present invention, the first processing unit group or the second processing unit group is composed of at least one titanium layer depositing unit and at least one unit selected from the group consisting of a titanium nitride layer depositing unit, a tantalum nitride layer depositing unit, and a tungsten nitride layer depositing unit. The ratio of the number of the titanium layer depositing unit and the number of the unit selected from the group consisting of the titanium nitride layer depositing unit, the tantalum nitride layer depositing unit, and the tungsten nitride layer depositing unit is 1:1, 1:2, 2:3, or 1:3.

According to an implementation mode of the present invention, the first processing unit group or the second processing unit group is composed of at least one tantalum layer depositing unit and at least one unit selected from the group consisting of a tantalum nitride layer depositing unit, a titanium nitride layer depositing unit, and a tungsten nitride layer depositing unit. The ratio of the number of the tantalum layer depositing unit and the number of the unit selected from the group consisting of the tantalum nitride layer depositing unit, the titanium nitride layer depositing unit, and the tungsten nitride layer depositing unit is 1:1, 1:2, 1:3, 2:3, 2:1, 3:2, or 3:1.

According to an implementation mode of the present invention, the processing apparatus further comprises a target substrate unloading portion that is disposed around the second transferring chamber and that directly unloads a target substrate that has been processed.

According to an implementation mode of the present invention, the first transferring arm and/or the second transferring arm has a frog leg shape.

According to an implementation mode of the present invention, the processing apparatus further comprises a first load lock chamber that connects the first transferring chamber and the substrate container holding table, and a second load lock chamber that connects the first transferring chamber and the second transferring chamber.

According to an implementation mode of the present invention, the first load lock chamber and/or the second load lock chamber also functions as an inspecting module for a target substrate.

According to an implementation mode of the present invention, at least one of processing units contained in the first processing unit group or the second processing unit group is an inspecting module for a target substrate.

According to an implementation mode of the present invention, the transferring chamber has a plurality of target substrate relaying portions that can be accessed by at least two of the transferring arms.

According to an implementation mode of the present invention, at least one of the units is disposed in the vertical direction of another unit.

According to an implementation mode of the present invention, at least one of the processing units contained in the first processing unit group or the second processing unit group comprises a susceptor having a tabletop on which a target substrate can be supported and a plurality of supporting pins protrusively disposed on the tabletop of the susceptor, the plurality of supporting pins being used for loading and unloading a target substrate, the center position of the supporting pins deviating from the center position of the susceptor.

According to an implementation mode of the present invention, the first transferring arm and/or the second transferring arm can be expanded, contracted, and swiveled. The center of the swiveling of the first transferring arm and/or the second transferring arm deviates from a front surface of a processing unit that is contained in the first processing unit group/the second processing unit group and that is the closest to the first transferring arm and/or the second transferring arm.

According to an implementation mode of the present invention, the first transferring arm and/or the second transferring arm can be expanded, contracted, and swiveled. The first transferring arm and/or the second transferring arm has a target substrate holding member that is asymmetrical to the direction in which the first transferring arm/the second transferring arm is expanded and contracted.

According to an implementation mode of the present invention, at least one of the processing units contained in the first processing unit group or the second processing unit group comprises a susceptor having a tabletop on which a target substrate can be supported and a plurality of supporting pins protrusively disposed on the tabletop of the susceptor, the plurality of supporting pins being used for loading and unloading a target substrate, and positioned on the tabletop in such a manner that the supporting pins do not interfere with the asymmetrical target substrate holding member of the first/the second transferring arm.

According to an implementation mode of the present invention, the center position of the plurality of supporting pins deviates from the center position of the susceptor.

According to an implementation mode of the present invention, the shapes of the target substrate holding members of the first/the second transferring arm are nearly same to each other.

According to an implementation mode of the present invention, the transferring apparatus further comprises a transferring mechanism that has a second arm that can be expanded, contracted, and swiveled and a second target substrate holding member, disposed on the forward end side of the second arm, wherein a center position of the swiveling of each of the arm and the second arm is fixed.

According to an implementation mode of the present invention, the center position of the swiveling of each of the arm and the second arm is defined so that a target substrate can be directly transferred by the expansion and the contraction of the arm and the second arm.

First Embodiment

Next, with reference to the accompanying drawings, a first embodiment of the present invention will be explained. FIG. 1 is a plan view showing a processing apparatus 1 according to the first embodiment of the present invention. As shown in FIG. 1, in the processing apparatus 1 according to the first embodiment of the present invention, a substrate container holding table 10, a first transferring chamber 30, and a second transferring chamber 50 are disposed. The substrate container holding table 10 holds a carrier cassette C as a container that can contain a plurality of wafers W (for example, 25 wafers W). The first transferring chamber 30 is disposed on the far side of the substrate container holding table 10. The second transferring chamber 50 is disposed on the far side of the first transferring chamber 30.

A first processing unit group 60, 70 is disposed around the first transferring chamber 30. A second processing unit group 80, 90, 100, 110, 120, 130, 140, and 150 is disposed around the second transferring chamber 50. The first transferring chamber 30 and the holding table 10 are connected through first load lock chambers 20, 20. The first transferring chamber 30 and the second transferring chamber 50 are connected through second load lock chambers 40, 40.

A plurality of carrier cassettes C (for example, four carrier cassettes C) can be placed on the holding table 10. A sub arm 21 is disposed between the holding table 10 and the first load lock chambers 20, 20. The sub arm 21 loads and unloads a wafer W to and from a carrier cassette C and the first load lock chambers 20, 20.

A transferring arm 31 is disposed nearly at the center of the first transferring chamber 30. The transferring arm 31 has a frog leg shape and is called a "frog leg arm". The "frog leg shape" transferring arm has a total of five sides whose center side is articulated with two sets of two-member arms. One two-member arm is expanded, contracted, and rotated (swiveled) along with the opposite two-member arm (see FIGS. 9A, 9B, 9C, 10A, 10B, and 10C, which are referred to later.). As shown in FIG. 1, two flag leg arms 31a, 31b can be disposed at opposite positions per transferring arm 31. In this case, one of two members of each two-member arm can be shared by each frog leg arm.

According to the first embodiment of the present invention, the transferring arm 31 composes a linearly moving and rotating mechanism that linearly moves and rotates wafer holding members 31a and 31b disposed at the position corresponding to the center one side. Alternatively, two wafer holding members may be disposed on the center one side of the transferring arm. When two holding members are used, they are disposed back to back with an angle of 180 degrees. With a dedicated motor, the two holding members may be reversely rotated.

In the processing apparatus 1 according to the first embodiment of the present invention, as the first processing unit group, pre-cleaning units 60 and 70 are disposed around the first transferring chamber 30. As the second processing unit group, two CVD units 80 and 90 are disposed on the near left side and the near right side of the second transferring chamber 50, respectively. In addition, four ALD units 100, 110, 120, and 130 are disposed around the second transferring chamber 50. The ALD units 100 and 120 and the ALD units 110 and 130 are disposed on the far left side and the far right side of the second transferring chamber 50, respectively. Two CVD units 140 and 150 are disposed on the farthest left side and the farthest right side of the second transferring chamber 50, respectively. The pre-cleaning units are existing cleaning units that are for example supercritical cleaning units using a supercritical fluid, reactive ion etching units that clean an object using a reactive gas, and spatter etching units that physically clean an object by a spattering etching method.

In the second transferring chamber 50, second transferring arms 41, 42, and 43 are disposed. A wafer w may be transferred between adjacent arms of the second transferring arms 41, 42, and 43. Alternatively, a wafer W may be transferred through at least one transferring portion (not shown: target substrate relaying portions that can be accessed by at least two transferring arms) disposed in the second transferring chamber 50.

The two CVD units 80 and 90 disposed on the nearest side of the second processing unit group are CVD units that deposit a titan (Ti) layer on a wafer W. The four ALD units 100 to 130 disposed on the farther side of the second processing unit group are ALD units that deposit a titanium nitride (TiN) layer on a wafer W. The CVD units 140 and 150 disposed on the farthest side of the second processing unit group are CVD units that deposit a tungsten (W) layer on a wafer W. ALD stands for Atomic Layer Deposition. A titanium layer, a titanium nitride, and a tungsten layer may be deposited by spattering units.

An inspecting module that inspects each or some of the film quality, film thickness, particles, and dimensions may be disposed as a part of the processing unit groups. Alternatively, a processing unit-that is equipped with a mechanism that performs such inspections may be disposed. In addition, an inspecting module may be disposed in the load lock chamber 20 or 40.

Instead of a part of processing units of the second processing unit group, a load lock chamber may be disposed. A substrate transferring unit including the substrate container holding table 10 may be connected to the load lock chamber. In this case, a substrate that has been processed may be directly unloaded from the transferring chamber 50.

Figure 2:
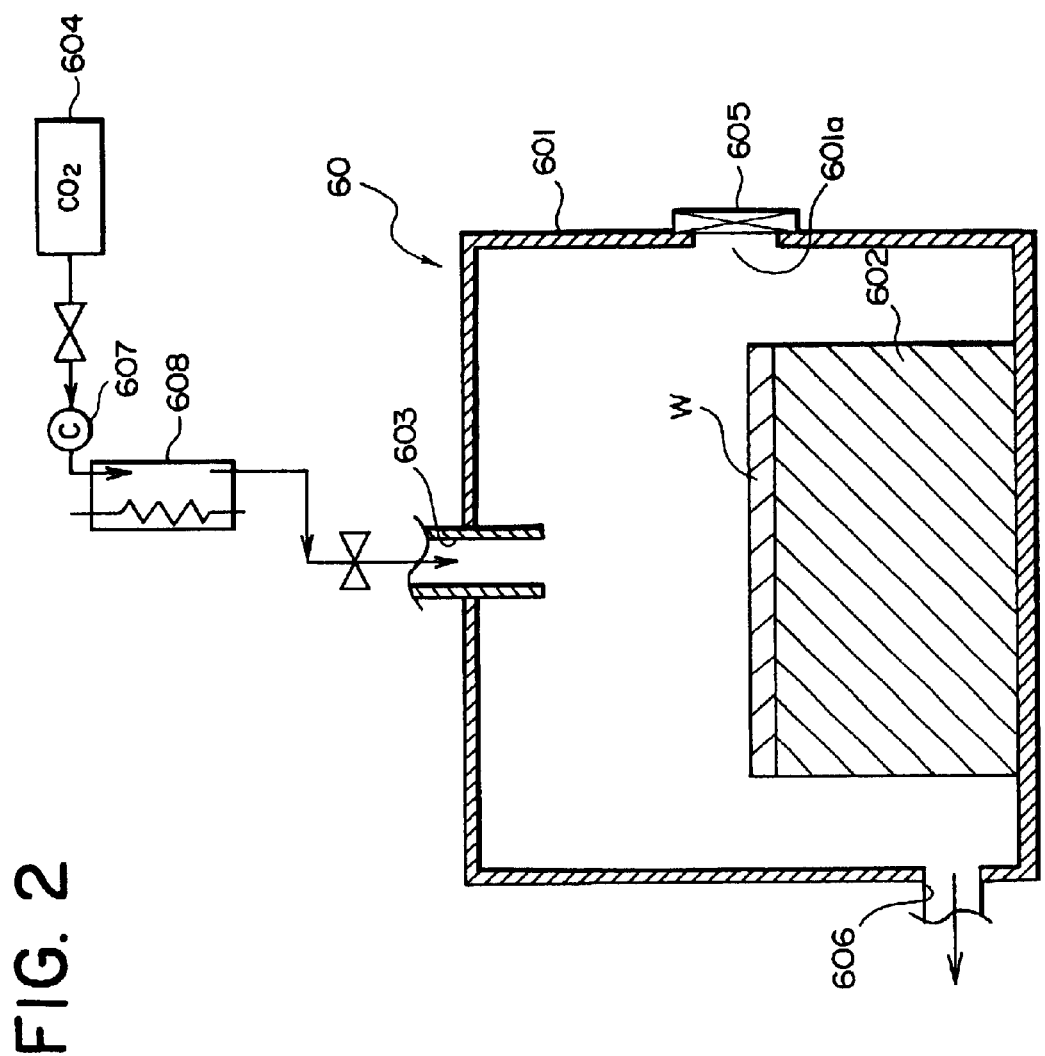
FIG. 2 is a vertical sectional view showing a pre-cleaning unit of the processing apparatus according to the first embodiment of the present invention.

FIG. 2 is a vertical sectional view showing the pre-cleaning unit 60 according to the first embodiment of the present invention. The pre-cleaning unit 60 according to the first embodiment of the present invention is a unit that cleans the front surface of a target substrate such as a wafer W with supercritical carbon dioxide. In the pre-cleaning unit 60, an inlet portion 603 is disposed. The inlet portion 603 inlets supercritical carbon dioxide to the interior of an air-tight and box-shaped processing chamber 601. Carbon dioxide is inlet from a carbon dioxide source 604. A compressor 607 compresses carbon dioxide. A heat exchanger 608 heats carbon dioxide. Thus, the compressor 607 and the heat exchanger 608 produce supercritical carbon dioxide. Supercritical carbon dioxide is supplied to the processing chamber 601 through the inlet portion 603. Supercritical carbon dioxide cleans the front surface of a wafer W placed on a susceptor 602. Carbon dioxide supplied to the processing chamber 601 is exhausted from an exhaust opening 606 along with a side product generated by the cleaning reaction.

As shown in FIG. 2, an opening portion 601a is formed in the wall of the processing chamber 601. The opening portion 601a is disposed on the right of the susceptor 602 in FIG. 2. The opening portion 601a is opened and closed by moving a gate valve 605 upward and downward. In FIG. 2, a first transferring arm (not shown) is disposed on the right of the gate valve 605. The first transferring arm is operated to access the processing chamber 601 through the opening portion 601a, load a wafer W to the processing chamber 601, place the wafer W on the susceptor 602, and unload the processed wafer W from the processing chamber 601.

Figure 3:
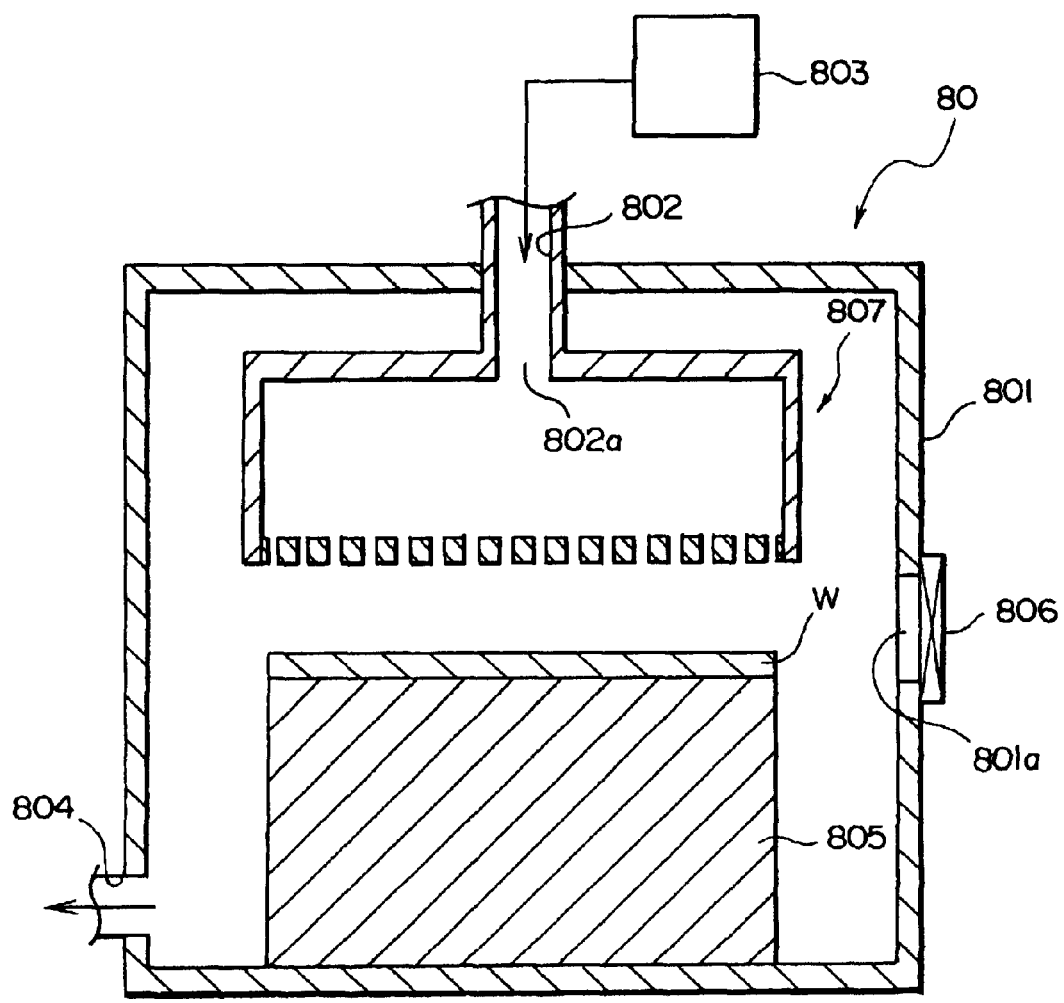
FIG. 3 is a vertical sectional view showing a CVD unit of the processing apparatus according to the first embodiment of the present invention.

FIG. 3 is a vertical sectional view showing the CVD unit 80 according to the first embodiment of the present invention. As shown in FIG. 3, a processing chamber 801 of the CVD unit 80 is air-tightly structured with for example aluminum wall. The processing chamber 801 has a heating mechanism and a cooling mechanism (not shown). A gas inlet pipe 802 is connected to an upper center portion of the processing chamber 801. The gas inlet pipe 802 inlets gas to the processing chamber 801. The processing chamber 801 and the gas inlet pipe 802 are connected. The gas inlet pipe 802 is connected to a gas supply source 803. Gas is supplied from the gas supply source 803 to the gas inlet pipe 802. The gas is supplied to the processing chamber 801 through the gas inlet pipe 802. The gas is a material of a thin film. When necessary, an inertia gas is used as a carrier gas.

A gas exhaust pipe 804 is connected to a lower portion of the processing chamber 801. The gas exhaust pipe 804 exhausts gas from the processing chamber 801. The gas exhaust pipe 804 is connected to an exhausting unit (not shown). The exhausting unit is for example a vacuum pump. The exhausting unit exhausts the gas from the processing chamber 801 through the gas exhaust pipe 804. The processing chamber 801 is kept at a desired pressure. A susceptor 805 is disposed at a lower portion of the processing chamber 801. The susceptor 805 holds a wafer W. According to the first embodiment of the present invention, a wafer W is placed on the susceptor 805 by a static chuck (not shown) whose diameter is nearly the same as that of the wafer W. A heating source unit (not shown) is disposed in the susceptor 805. The heating source unit allows the process surface of a wafer W placed on the susceptor 805 to be adjusted at a desired temperature.

As shown in FIG. 3, an opening portion 801a is formed in the wall of the processing chamber 801. The opening portion 801a is disposed on the right of the susceptor 805 in FIG. 3. A wafer W is loaded and unloaded through the opening portion 801a. The opening portion 801a is opened and closed by moving a gate valve 806 upward and downward. In FIG. 3, a second transferring arm (not shown) is disposed on the right of the gate valve 806. The second transferring arm is operated to access the processing chamber 801 through the opening portion 801a, load a wafer W to the processing chamber 801, place the wafer W on the susceptor 805, and unload the processed wafer W from the processing chamber 801. A shower head 807 as a shower member is disposed above the susceptor 805. The shower head 807 is disposed between the susceptor 805 and the gas inlet pipe 802 to divide the inner space of the processing chamber 801. The shower head 807 is made of for example aluminum.

A gas introducing opening 802a of the gas inlet pipe 802 is placed at an upper center portion of the shower head 807. A gas supplied to the processing chamber 801 is directly supplied to the shower head 807 disposed in the processing chamber 801.

In the forgoing example, as excitation energy of the CVD reaction, heat is used. Alternatively, as excitation energy, plasma discharging may be used.

Figure 4:
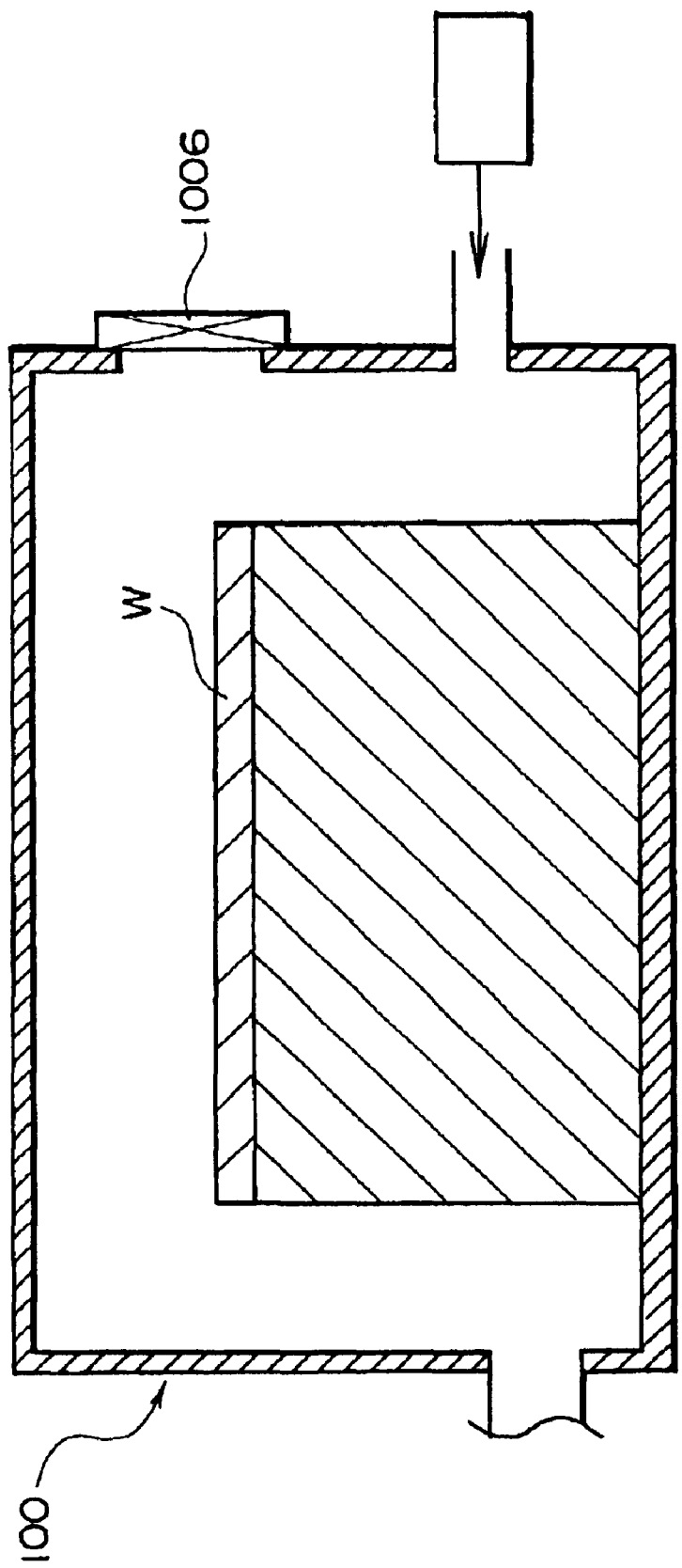
FIG. 4 is a vertical sectional view showing an ALD unit of the processing apparatus according to the first embodiment of the present invention.

FIG. 4 is a vertical sectional view showing the ALD unit 100 according to the first embodiment of the present invention. The structure of the ALD unit 100 is nearly the same as the structure of the forgoing CVD unit except that the shower unit is removed from the CVD unit and thereby the volume of the chamber is decreased. Moreover, the ALD unit 100 deposits a film in an atomic level one layer by one layer by repeatedly supplying a pulsated process gas to a processing chamber and exhausting it therefrom.

Next, steps for the processing apparatus 1 according to the first embodiment of the present invention to fabricate a semiconductor device will be explained. FIG. 5 is a flow chart for which the processing apparatus 1 according to the first embodiment of the present invention fabricates a semiconductor device. FIGS. 6A, 6B, 6C, 6D, and 6E are vertical sectional views showing a semiconductor device fabricated by the processing apparatus 1.

Figure 6A:
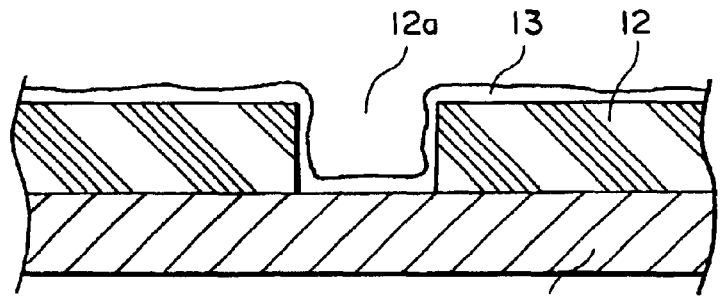
FIGS. 6A, 6B, 6C, 6D, and 6E are vertical sectional views showing a semiconductor device fabricated by the processing apparatus according to the first embodiment of the present invention.

First of all, a carrier cassette C that contains 25 untreated wafers W is placed on the holding table 10. Thereafter, the processing apparatus 1 is activated. The sub arm 21 is operated to access the carrier cassette C, take out a untreated wafer W therefrom, and place the wafer W in the first load lock chamber 20. Thereafter, the gate valve (not shown) disposed on the holding table 10 side is closed in the first load lock chamber 20. Thereafter, the inner pressure of the first load lock chamber 20 is raised until the inner pressure nearly becomes the same as the inner pressure of the first transferring chamber 30. Thereafter, the gate valve (not shown) disposed on the transferring chamber side is opened in the first load lock chamber 20 is opened. The, transferring arm 31 is operated to access the first load lock chamber 20, take out the wafer W therefrom, and load it to the pre-cleaning unit (supercritical cleaning unit) 60. As shown in FIG. 6A, before a wafer W is pre-cleaned, an insulation layer 12 (for example, a SiO$_2$ layer) has been formed with a predetermined pattern on the upper surface of a base material 11. The entire surface of the wafer W on which the insulation layer 12 has been formed is covered with a natural oxide film 13.

The gate valve 605 of the pre-cleaning unit 60 is air-tightly closed. Thereafter, the wafer W is heated and pressured in the pre-cleaning unit 60. After a predetermined state has taken place, supercritical carbon dioxide (CO$_2$) is supplied to the pre-cleaning unit 60.

Figure 6B:
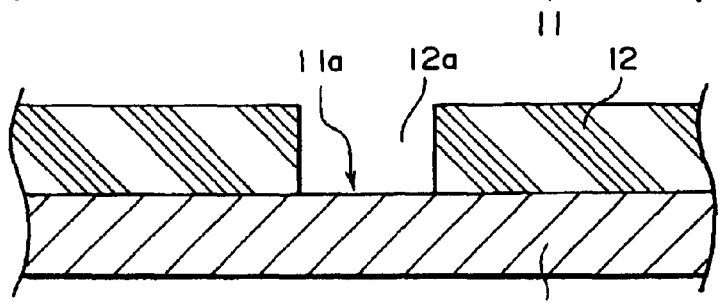

Supercritical carbon dioxide dissolves the natural oxide film 13 formed on the entire surface of the wafer W (see FIG. 6B). At that point, an oxide film resides on the front surface 11a of the base material 11 exposed to the front surface of the wafer W through an opening portion 12a of the insulation layer 12.

Thereafter, the supply of carbon dioxide to the pre-cleaning unit 60 is stopped. The transferring arm 31 is operated to access the pre-cleaning unit 60 and take out the wafer W that has been pre-cleaned therefrom. Thereafter, the gate valve (not shown) disposed on the first transferring chamber side is opened in the second load lock chamber 40. The transferring arm 31 loads the wafer W to the second load lock chamber 40. In the state, all the gate valves of the second load lock chamber 40 are air-tightly closed. The inner pressure of the second load lock chamber 40 is lowered so that the inner pressure nearly becomes the same as the inner pressure of the second transferring chamber 50. Thereafter, the gate valve disposed on the second transferring chamber side is opened in the second load lock chamber 40. The second transferring arm 41 is operated to access the second load lock chamber 40, take out the wafer W therefrom, and load the wafer W to the CVD unit 80 that deposits titanium layer. In the state, the gate valve 806 of the CVD unit 80 is air-tightly closed. Under predetermined temperature and pressure conditions, a titanium (Ti) layer is deposited on the wafer W.

Figure 6C:
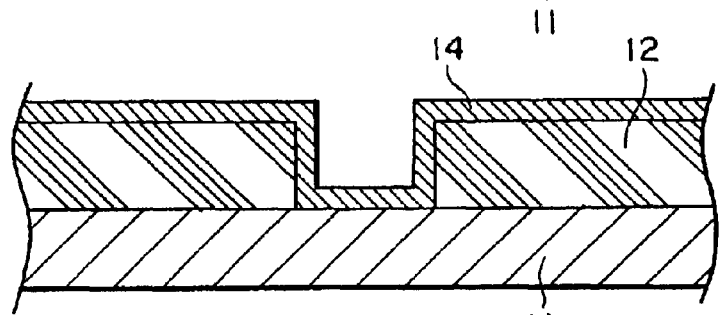

By the reducing operation of titanium (Ti), a residual oxide film adhered on the base material 11 exposed to the wafer W is removed on the front surface of the wafer W. As a result, the front surface of the base material is exposed. When the titanium (Ti) layer depositing step is continued, as shown in FIG. 6C, a titanium (Ti) layer 14 is deposited on the front surface 11a of the exposed base material 11. As a result, the electric characteristic of the front surface of the base material is improved.

Figure 6D:
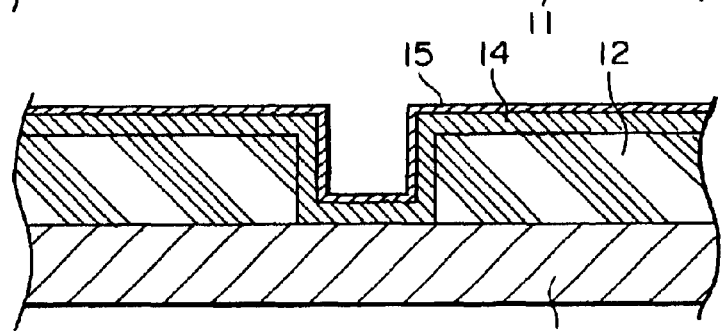

After the predetermined titanium (Ti) layer 14 has been deposited, the supply of the titanium layer deposition gas is stopped. Thereafter, the gate valve 806 is opened. The second transferring arm 41 is operated to access the CVD unit 80, take out the wafer W therefrom, and transfer the wafer W to the second transferring arm 42 disposed at the center of the second transferring chamber 50. The second transferring arm 42 loads the wafer W to one of the ALD units 100 to 130 disposed on the far side of the second transferring chamber 50. For example, the second transferring arm 42 loads the wafer W to the ALD unit 100. In the same manner as the forgoing CVD process, under predetermined conditions, a process gas is supplied to the ALD unit 100. As a result, as shown in FIG. 6D, a titanium nitride (TiN) layer 15 is deposited on the titanium (Ti) layer 14 as the top layer of the wafer W (at step 3).

Figure 6E:
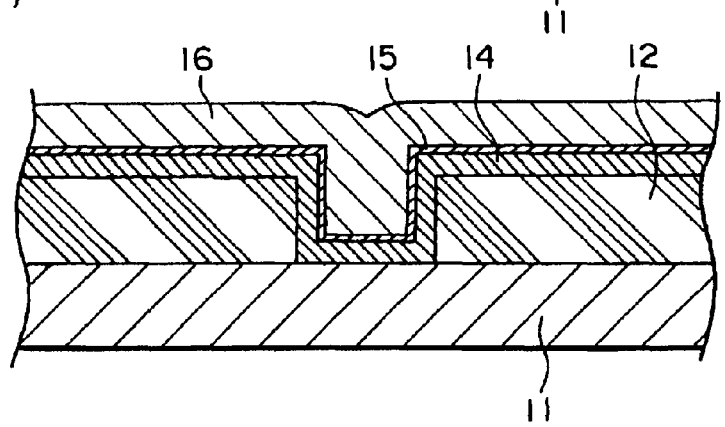

After the titanium nitride (TiN) layer 15 has been deposited, the supply of the titanium nitride layer deposition gas is stopped. Thereafter, the gate valve 1006 is opened. The second transferring arm 42 is operated to access the ALD unit 100, take out the wafer W therefrom, and transfer it to the second transferring arm 43 on the farthest side. The second transferring arm 43 is operated to load the wafer W to the CVD unit 140 or 150 (for example, the CVD unit 140) disposed on the farthest side. As with the forgoing CVD process, under predetermined conditions, a process gas is supplied to the CVD unit 140. As a result, tungsten (W) is deposited on the front surface of the titanium nitride (TiN) layer 15 as the top layer of the wafer W. Thus, as shown in FIG. 6E, a tungsten (w) layer 16 is deposited on the front surface of the wafer W (at step 4).

After the steps for which the natural oxide film 13 is removed and the tungsten (W) layer 16 is deposited have been completed, the wafer W is returned to the carrier cassette C through the second transferring arms 43 to 41, the second load lock chamber 40, the first transferring chamber 30, and the first load lock chamber 20.

In the processing apparatus 1 according to the first embodiment of the present invention, processing unit groups that are operated under different process pressures are connected through a load lock chamber. Thus, a wafer W can be successively processed, without being exposed to outer air, from a cleaning process performed under a high pressure condition to a film depositing process performed under a low pressure condition. Thus, a wafer W can be processed at high speed and a fabricating cost becomes low.

Particularly, in the processing apparatus 1 according to the first embodiment of the present invention, since four processing units 100, 110, 120, and 130 of eight processing units that compose the second processing unit group are used as ALD units that deposit a titanium nitride (TiN) layer, the total process speed does not depend on the process time of the ALD units whose process speed is lower than the CVD units. In other words, when a plurality of wafers W are successively processed and the CVD process is followed by the ALD process, wafers W for which the CVD process has been performed are processed by two ALD units. As a result, the total process time does not depend on the process time of the ALD units that take a long process time. Thus, the total process time of the second processing unit group can be shortened.

Figure 7:
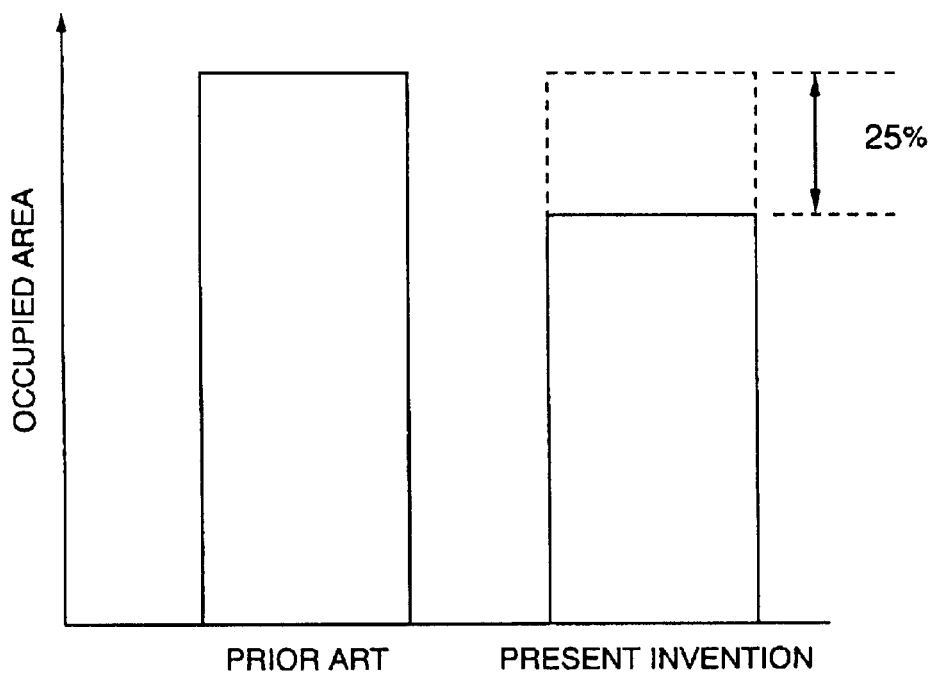
FIG. 7 is a graph that compares the area efficiency of the processing apparatus according to the first embodiment of the present invention and the area efficiency of an existing apparatus.
Figure 8:
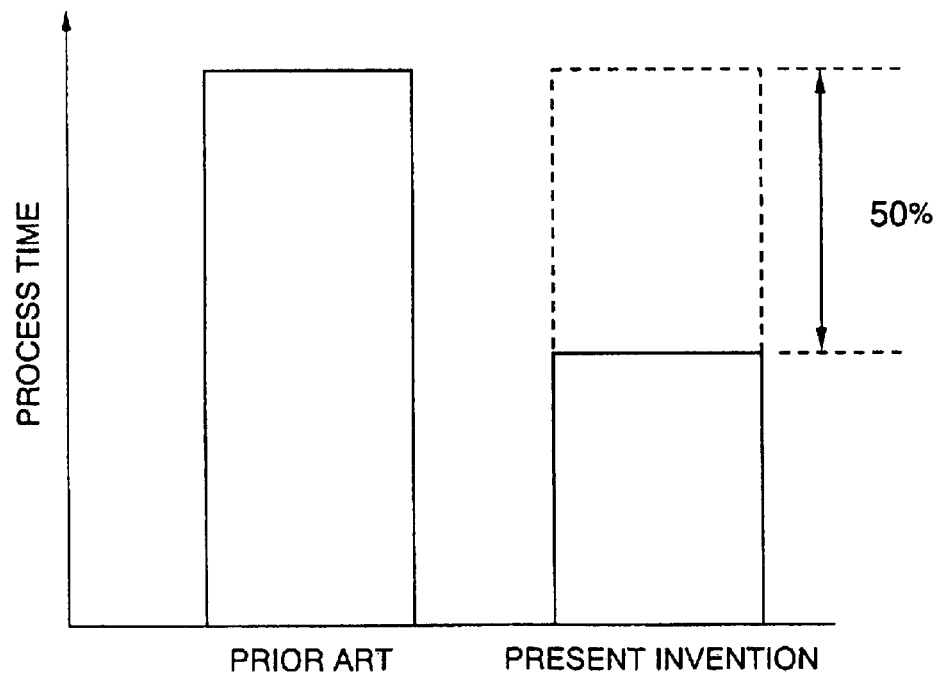
FIG. 8 is a graph that compares the process speed of the processing apparatus according to the first embodiment of the present invention and the process speed of an existing apparatus.

In addition, it is not necessary to take out a wafer W from the processing apparatus in the middle of a film depositing process. Thus, a film that is being deposited can be prevented from being oxidized or deteriorated. As a result, a film can be deposited in high quality. Experimental results show that the area efficiency and process speed of the processing apparatus according to the first embodiment of the present invention are superior to those of an existing processing apparatus by 25% and 50%, respectively as shown in graphs of FIGS. 7 and 8.

Figure 9A:
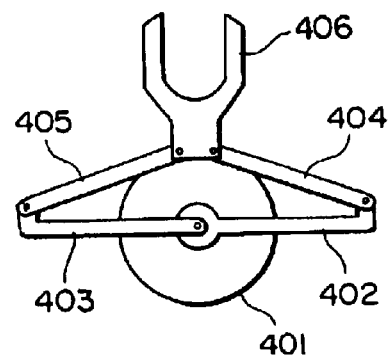
FIGS. 9A, 9B, and 9C are schematic diagrams showing the structure and the expanding and contracting operations of a transferring arm applicable for the processing apparatus according to the first embodiment of the present invention.

Next, the transferring arm 41 (42, 43, 31) as a transferring unit will be further explained. FIG. 9A is a plan view showing an example of the structure of the transferring arm 41. As shown in FIG. 9A, the transferring arm 41 has a rotating center member 401, arms 402 and 403, arms 404 and 405, and a wafer supporting member (wafer holding member) 406. First end portions of the arms 402 and 403 are supported at the center of the rotating center member 401 so that the arms 402 and 403 are horizontally rotatable. First end portions of the arms 404 and 405 are connected to and supported by second end portions of the arms 402 and 403, respectively, so that the arms 404 and 405 are horizontally rotatable. The wafer supporting member 406 is pivoted by second end portions of the arms 404 and 405. When necessary, the arms 402 and 403 are rotated about a portion pivoted by the rotating center member 401 (hereinafter, this portion is simply called "the center").

A second set of arms (equivalent the arms 404 and 405) and a wafer supporting member (equivalent to the wafer supporting member 406) may be disposed at an outer end portion of the arms 402 and 403 from the center so that the two sets are disposed back to back as shown in FIG. 1.

Figure 9B:
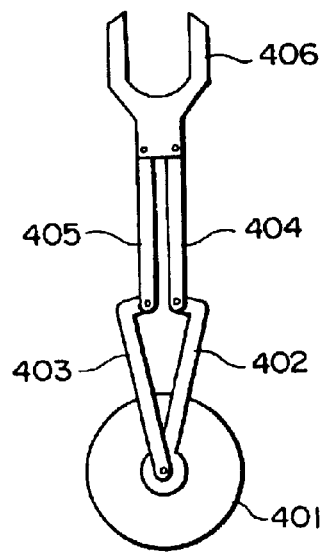
Figure 9C:
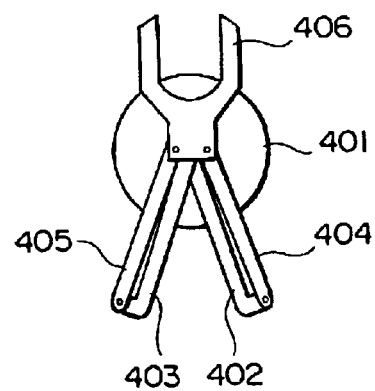

FIG. 9B shows the case that the arms 402 and 403 shown in FIG. 9A approach to each other on the upper side. Thus, as shown in FIG. 9B, the arms 404 and 405 protrude from the center. As a result, the wafer supporting member 406 connected to the second end portions of the arms 404 and 405 moves in the radial direction. FIG. 9C shows the case that the arms 402 and 403 shown in FIG. 9A are rotated so that they approach to each other on the lower side. As a result, the arms 404 and 405 approach to the center as shown in FIG. 9C. Thus, the wafer supporting member 406 connected to the second end portions of the arms 404 and 405 approaches to the center.

Thus, it is clear that as the arm 402 and the arm 403 are symmetrically rotated, the wafer supporting member 406 are linearly moved from the center of the rotating center member 401 in the radial direction.

Figure 10A:
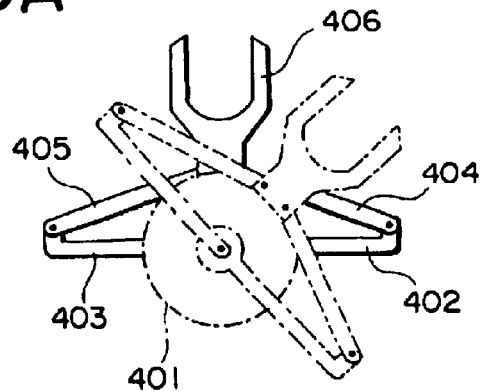
FIGS. 10A, 10B, and 10C are schematic diagrams showing swiveling operations of the transferring arm shown in FIGS. 9A, 9B, and 9C, respectively.
Figure 10B:
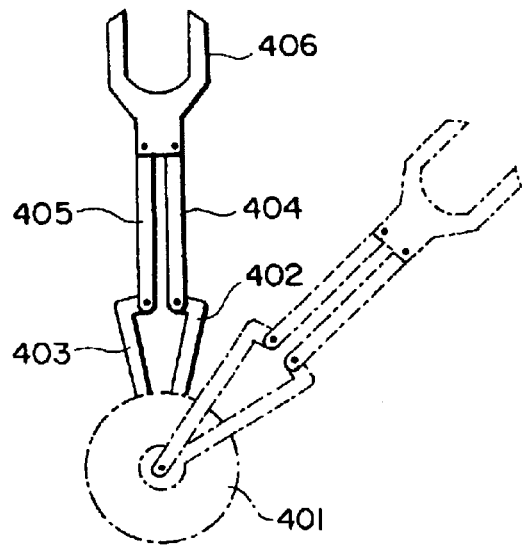
Figure 10C:
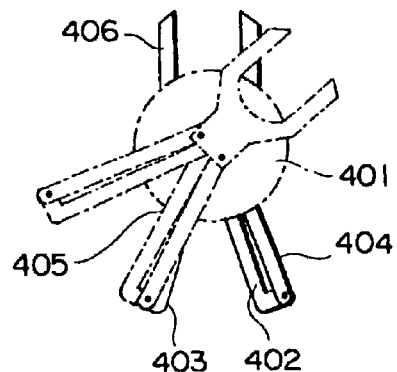

FIG. 10A shows the case that the arms 402 and 403 shown in FIG. 9A are rotated in the same direction (in the right rotating direction) as denoted by a dot-dash line. FIG. 10B shows the case that the arms 402 and 403 shown in FIG. 9B are rotated in the same direction (in the right rotating direction) as denoted by a dot-dash line. FIG. 10C shows the case that the arms 402 and 403 shown in FIG. 9C are rotated in the same direction (in the right rotating direction) as denoted by a dot-dash line.

Thus, it is clear that as the arms 402 and 403 are rotated in the same direction, the wafer supporting member 406 is rotated (swiveled) about the rotating center member 401. In addition, it is clear that FIGS. 9A, 9B, and 9C and FIGS. 10A, 10B, and 10C show that the swiveling and the linear movement in the radial direction can be independently performed.

As shown in FIGS. 9A to 9C and 10A to 10C, the wafer supporting member 406 has a "U" letter shape plane. As a result, when a wafer W is loaded to a processing unit and unloaded therefrom, the wafer supporting member 406 can be prevented from interfering with vertically movable supporting pins that are protrusively disposed in the wafer susceptor.

Figure 11:
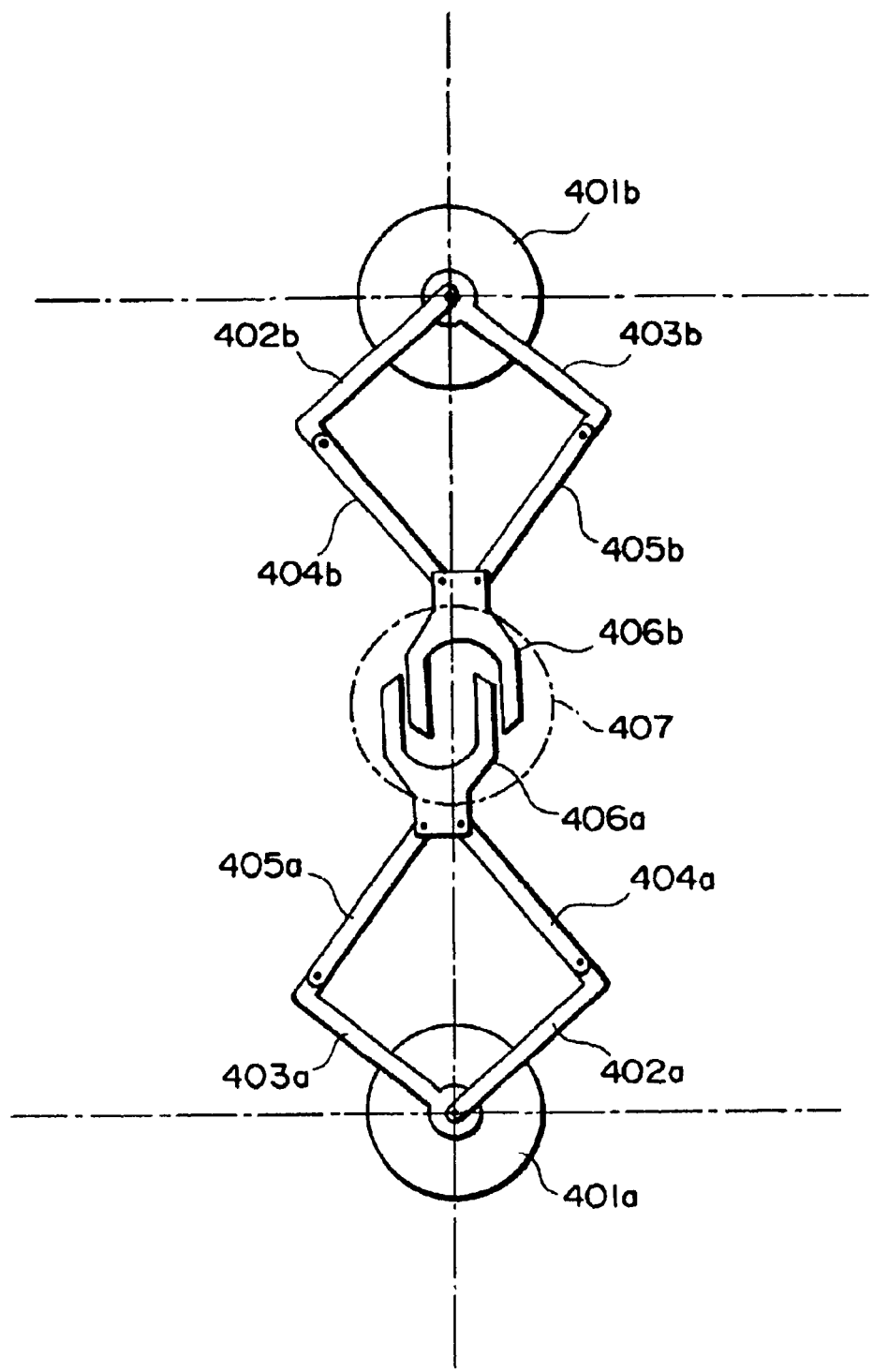
FIG. 11 is a schematic diagram for explaining the transferring operations for a target substrate by the two transferring arms shown in FIGS. 9A, 9B, 9C, 10A, 10B, and 10C.

FIG. 11 is a schematic diagram for explaining an example of transferring operations for a wafer by transferring arms. In FIG. 11, a first transferring arm is denoted by a suffix "a", whereas a second transferring arm is denoted by a suffix "b".

As shown in FIG. 11, when the first transferring arm is operated to transfer a wafer 407 to an adjacent transferring arm (namely, the second transferring arm), the orientations of the transferring arms are inclined so that the wafer supporting member 406a does not contact with the wafer supporting member 406b. When a transferring arm that receives the wafer 407 is moved upward, the wafer 407 is transferred thereto from a transferring arm that supports the wafer 407. As a result, the transferring operation for the wafer 407 can be completed without an interference of the transferring arms. When the wafer 407 is transferred without an inclination of the transferring arms, the wafer supporting member 406a contacts with the wafer supporting member 406b. This is because the shapes of the transferring arms are the same and each is horizontally symmetrical.

In the forgoing description, "the orientations of the transferring arms are inclined" is exemplified. Alternatively, when the orientation of at least one of the transferring arms is inclined against the orientation of the other transferring arm, the wafer 407 can be transferred from one transferring arm to another transferring arm without an interference thereof.

Figure 12A:
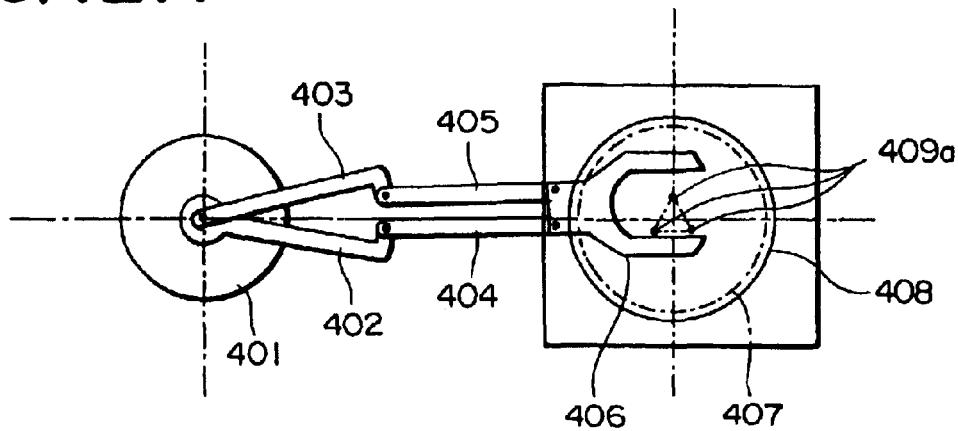
FIGS. 12A, 12B, and 12C are schematic diagrams for explaining a loading operation and an unloading operation for a target substrate to and from a processing unit by the transferring arms shown in FIGS. 9A, 9B, 9C, 10A, 10B, and 10C.
Figure 12B:
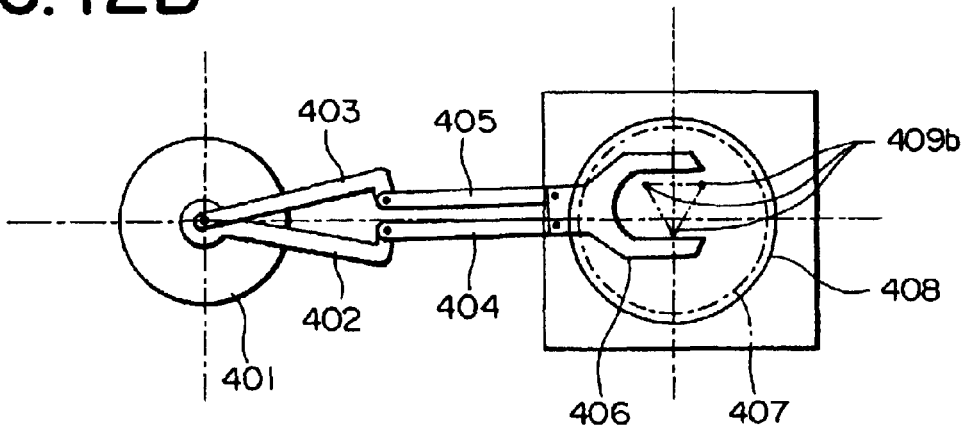
Figure 12C:
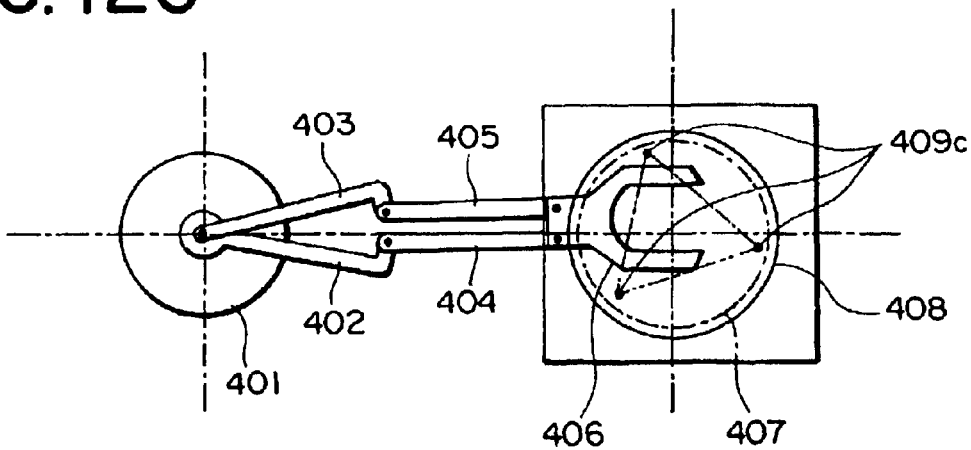

FIGS. 12A, 12B, and 12C are schematic diagrams for explaining the relation between a transferring arm and a processing unit. As was described with reference to FIG. 11, when the wafer 407 is transferred from one transferring arm to another transferring arm without an interference thereof, it is inevitable that the support position of the wafer 407 by transferring arms is asymmetrical (See FIG. 11). Thus, it is necessary to load the wafer 407 that is asymmetrically supported to a processing unit and unload it therefrom without a problem. In this case, there is a problem with respect to the relation between the position of the wafer supporting member and the positions of supporting pins that are protrusively disposed in the susceptor of a processing unit.

FIG. 12A shows the case that supporting pins 409a that are used to lift a wafer and that are disposed in a susceptor 408 are positioned near a center portion of the susceptor 408 so that the supporting pins 409a do not interfere with the wafer supporting member 406. In this case, the support position of the wafer supporting member 406 is asymmetrical to the wafer 407, the wafer supporting member 406 does not interfere with the supporting pins 409a. In addition, the supporting pins 409a can vertically move the wafer 407 without a problem.

FIG. 12B shows the case that supporting pins 409b that are used to lift a wafer and that are disposed in the susceptor 408 of a processing unit are positioned at a non-center portion (a deviating position from the center) of the suscepter 408 so that the supporting pins 409b do not interfere with the wafer supporting member 406. In this case, the wafer supporting member 406 does not interfere with the supporting pins 409b. In addition, the supporting pins 409b can vertically move the wafer 407 without a problem.

FIG. 12C shows the case that supporting pins 409c that are used to lift a wafer and that are disposed in the suscepter 408 of a processing unit are positioned at a peripheral portion of the susceptor 408 so that the supporting pins 409c do not interfere with the wafer supporting member 406. In this case, the wafer supporting member 406 does not interfere with the supporting pins 409c. In addition, the supporting pins 409c can vertically move the wafer 407 without a problem.

Figure 13A:
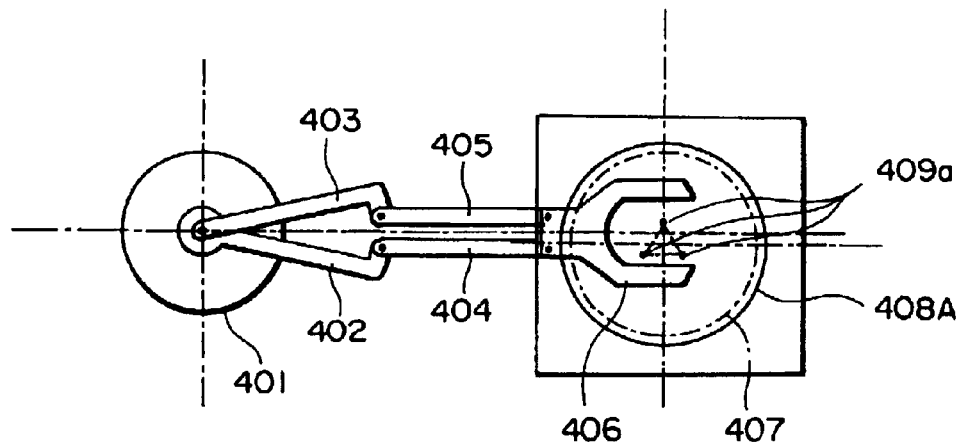
FIGS. 13A, 13B, and 13C are schematic diagrams for explaining another loading operation and another unloading operation for a target substrate to and from a processing unit by the transferring arms shown in FIGS. 9A, 9B, 9C, 10A, 10B, and 10C.
Figure 13B:
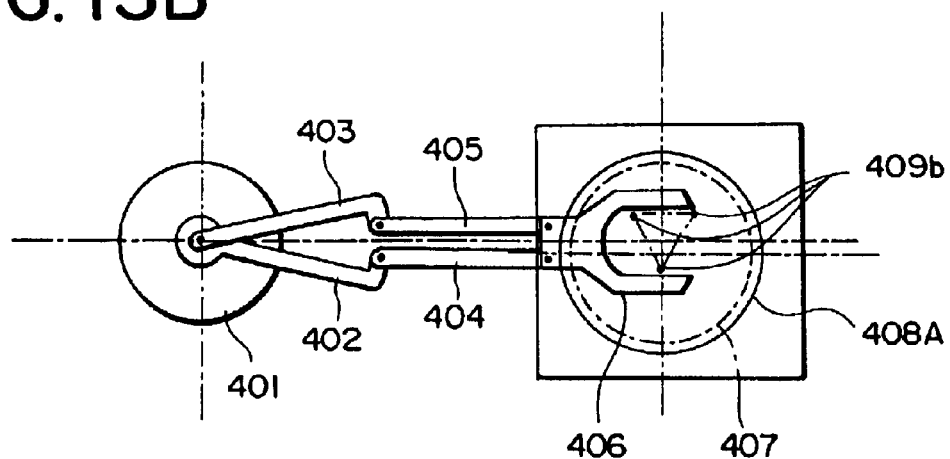
Figure 13C:
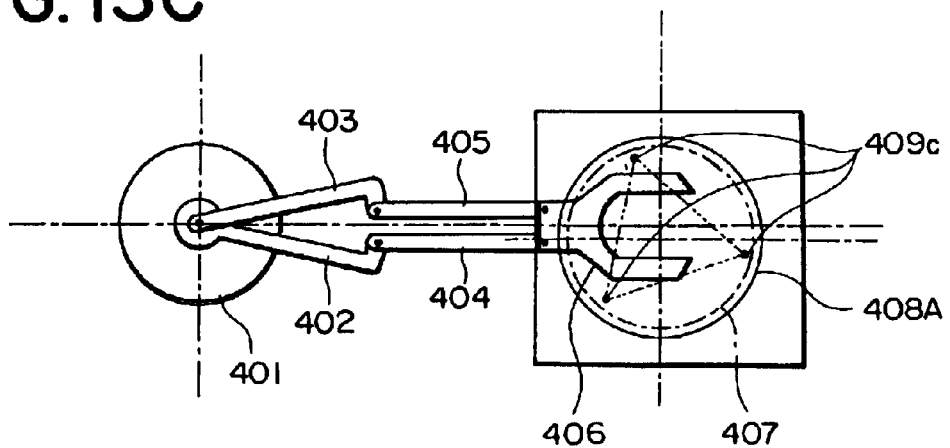

FIGS. 13A, 13B, and 13C show the cases that the position of a processing unit (thus, the position of a susceptor 408A) is changed a length for which the wafer supporting member 406 is asymmetrical to the wafer 407 (thus, the orientation of the transferring arm that accesses a processing unit is nearly perpendicular thereto), corresponding to FIGS. 12A, 12B, and 12C, respectively. When a processing unit is disposed in such a manner, the wafer 407 can be loaded thereto and unloaded therefrom without need to consider the asymmetricalness between the wafer 407 and the wafer supporting member 406.

Figure 14:
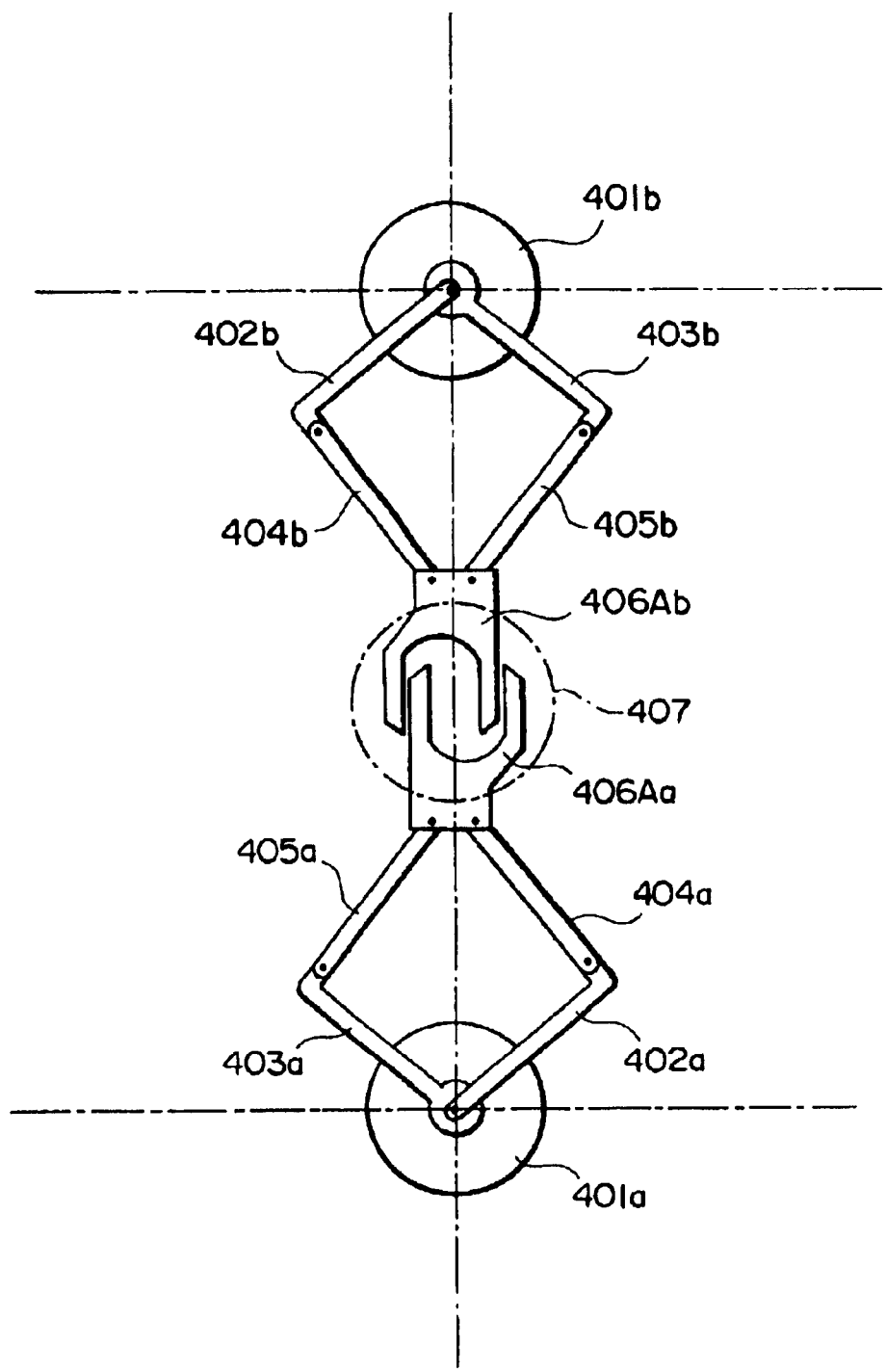
FIG. 14 is a schematic diagram for explaining a transferring operation for a target substrate by two transferring arms that are different from the transferring arms shown in FIGS. 9A, 9B, 9C, 10A, 10B, and 10C.

FIG. 14 is a schematic diagram for explaining another example of a transferring operation for a wafer by transferring arms. In FIG. 14, a first transferring arm is denoted by a suffix "a", whereas a second transferring arm is denoted by a suffix "b".

As shown in FIG. 14, the shape of a wafer supporting member 406Aa of the first transferring arm and the shape of a wafer supporting member 406Ab of the second transferring arm are asymmetrical to the direction in which the first transferring arm/the second transferring arm is expanded and contracted. With the wafer supporting members 406Aa and 406Ab, when the first transferring arm is straightly approached to the second transferring arm, they can be prevented from contacting as shown in FIG. 14. When a transferring arm that receives a wafer 407 is moved upward, the wafer 407 is transferred thereto from a transferring arm that supports the wafer 407. Thus, the transferring operations for the wafer 407 by the two transferring arms can be completed without an interference thereof. In this case, the shape of the first transferring arm is the same as the shape of an adjacent transferring arm (second transferring arm). However, when the first transferring arm and the second transferring arm are horizontally asymmetrical, the first and second transferring arms can be prevented from interfering.

To prevent transferring arms that transfer the wafer 407 from interfering, it is possible to form them in different shapes. For example, one transferring arm may be formed in a "U" letter shape, whereas the other transferring arm may be formed in a "W" letter shape. In this case, the "U" letter shape wafer supporting member does not interfere with the "W" letter shape wafer supporting member since "U" letter and "W" letter are complementary to each other as a letter shape.

When the shapes of adjacent transferring arms are different and at least one of them is horizontally asymmetrical, they can be prevented from interfering. For example, when the shape of one transferring arm is horizontally symmetrical (for example, the shape as shown in FIGS. 9A, 9B, and 9C) and the shape of the other transferring arm is asymmetrical with respect to the center line, the transferring arms can be prevented from interfering.

Figure 15A:
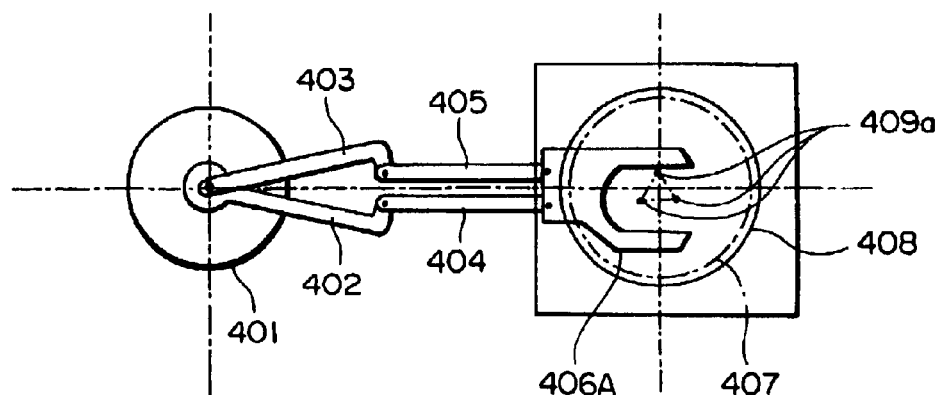
FIGS. 15A, 15B, and 15C are schematic diagrams for explaining a loading operation and an unloading operation of a target substrate to and from a processing unit by the transferring arms shown in FIG. 14.
Figure 15B:
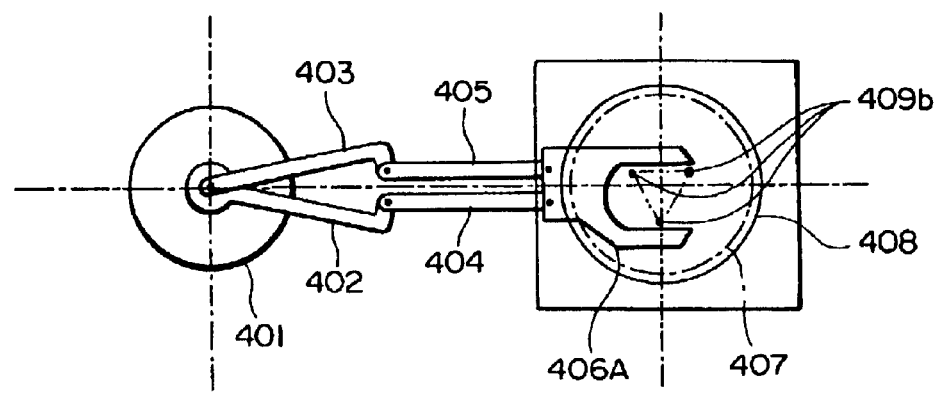
Figure 15C:
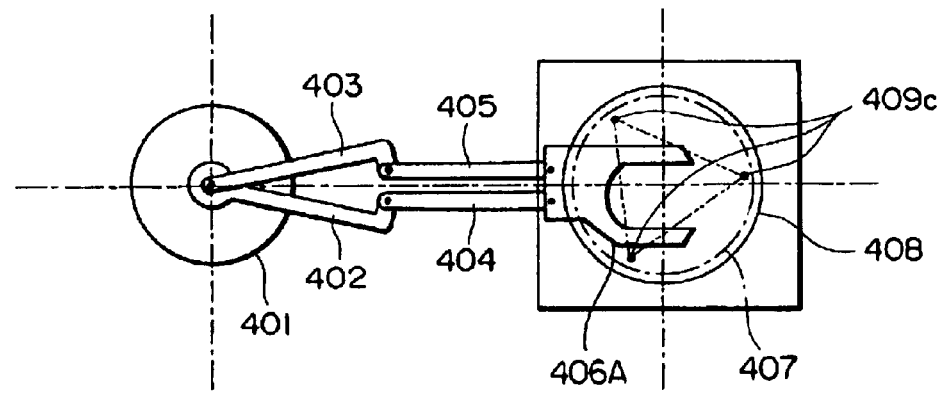

FIGS. 15A, 15B, and 15C are schematic diagrams for explaining the relation between the transferring arms shown in FIG. 14 and a processing unit. As shown in FIG. 14, when a wafer supporting member 406A having a shape that prevents transferring arms from interfering is used, there is a problem with respect to the relation between the positions of supporting pins that are protrusively disposed in the susceptor of a processing unit and the position of the wafer supporting member 406A. This is because the support position of the wafer supporting member 406A is asymmetrical to the wafer 407 as shown in FIG. 14.

FIG. 15A shows the case that supporting pins 409a that are disposed in the susceptor 408 of a processing unit and that are used to lift a wafer are positioned near a center portion of the susceptor 408 so that the supporting pins 409a do not interfere with the wafer supporting member 406A. As a result, even if the supporting portion of the wafer supporting member 406A is asymmetrical to the wafer 407, the wafer supporting member 406A does not interfere with the supporting pins 409a. In addition, the supporting pins 409a can vertically move the wafer 407 without a problem.

FIG. 15B shows the case that supporting pins 409b that are disposed in the susceptor 408 of a processing unit and that are used to lift a wafer are positioned at a non-center portion (a deviating position from the center) of the susceptor 408 so that the supporting pins 409b do not interfere with the wafer supporting member 406A. In this case, the wafer supporting member 406A does not interfere with the supporting pins 409b. In addition, the supporting pins 409b can vertically move the wafer 407 without a problem.

FIG. 15C shows the case that supporting pins 409c that are disposed in the susceptor 408 of a processing unit and that are used to lift a wafer are positioned at a peripheral portion of the susceptor 408 so that the supporting pins 409c do not interfere with the wafer supporting member 406A. In this case, the wafer supporting member 406A does not interfere with the supporting pins 409c. In addition, the supporting pins 409c can vertically move the wafer 407 without a problem.

In the forgoing, an example whose transferring operations for a wafer are performed by transferring arms has been explained. Of course, as an existing method, a wafer may be indirectly transferred from one transferring arm to an adjacent transferring arm through a relaying table (since its shape is not limited to a tabletop, it is a target substrate relaying portion).

Second Embodiment

Figure 16:
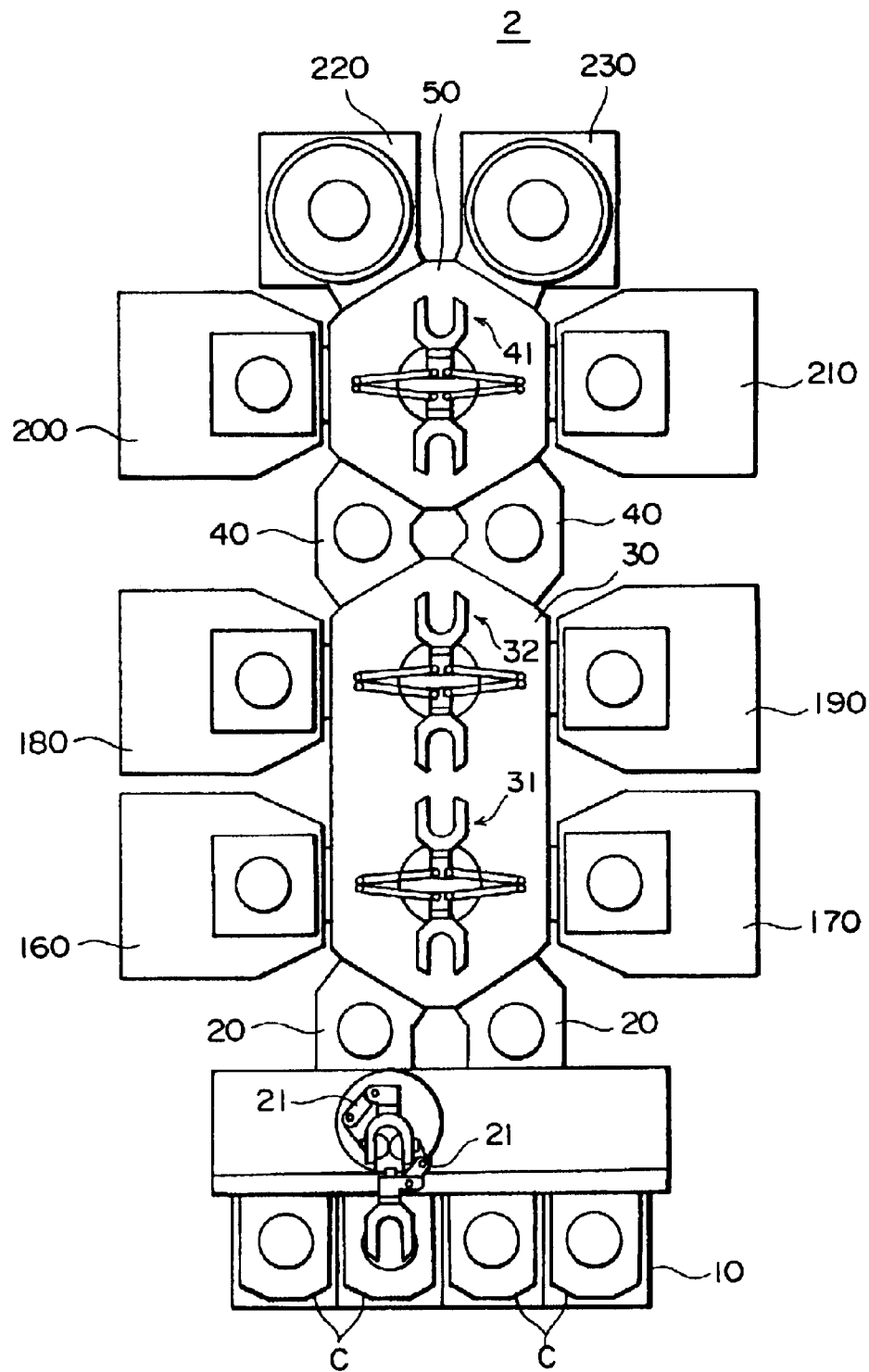
FIG. 16 is a plan view showing a processing apparatus according to a second embodiment of the present invention.

Next, a second embodiment of the present invention will be explained. FIG. 16 is a plan view showing a processing apparatus 2 according to the second embodiment of the present invention. As shown in FIG. 16, the processing apparatus 2 according to the second embodiment of the present invention has a substrate container holding table 10, a first transferring chamber 30, and a second transferring chamber 50. The substrate container holding table 10 holds a carrier cassette C that contains wafers W. The first transferring chamber 30 is disposed on the far side of the holding table 10. The second transferring chamber 50 is disposed on the far side of the first transferring chamber 30.

A first processing unit group is disposed around the first transferring chamber 30. The first processing unit group is composed of two pre-cleaning units 160 and 170 and two CVD units 180 and 190. The pre-cleaning units 160 and 170 are disposed on the left and right of the first transferring chamber 30, respectively. The two CVD units 180 and 190 are disposed on the far left side and far right side of the pre-cleaning units 160 and 170, respectively. The pre-cleaning units 160 and 170 are reactive clean units that are operated under a low vacuum environment. The CVD units 180 and 190 are CVD units that deposit a tantalum nitride (TaN) layer.

A second processing unit group is disposed around the second transferring chamber 50. The second processing unit group is composed of only spattering units. Two spattering units 200 and 210 are disposed on the near side of the second transferring chamber 50. The spattering units 200 and 210 deposit a tantalum (Ta) layer. Two spattering units 220 and 230 are disposed on the far side of the second transferring chamber 50. The spattering units 220 and 230 deposit a copper (Cu) layer. The four spattering units 200, 210, 220, and 230 are processing units that are operated under a high vacuum environment.

Figure 17:
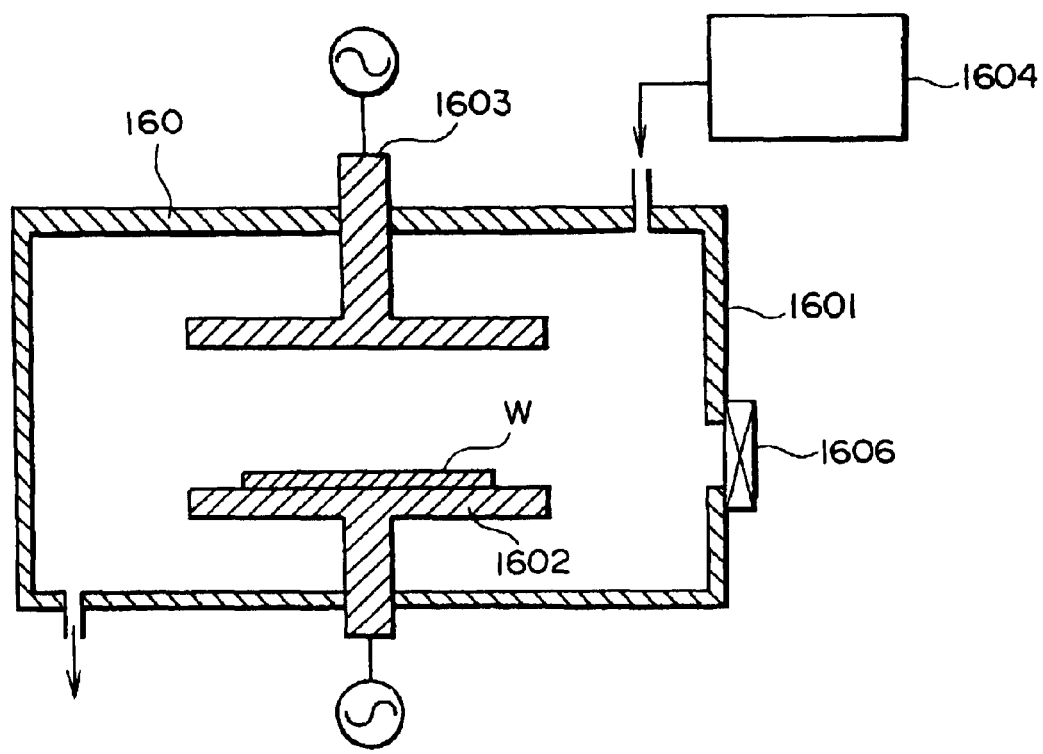
FIG. 17 is a vertical sectional view showing a reactive clean unit of the processing apparatus according to the second embodiment of the present invention.

FIG. 17 is a vertical sectional view showing the pre-cleaning unit 160 according to the second embodiment of the present invention. The pre-cleaning unit 160 according to the second embodiment of the present invention is a reactive clean unit. The pre-cleaning unit 160 cleans the front surface of a target substrate with a cleaning gas.

A cleaning gas such as hydrogen gas ($H_2$) or a gas containing halogen ($NF_3$) is supplied from a gas supplying source 1604 to a processing chamber 1601. The cleaning gas is excited and activated by an upper electrode 1603. The front surface of a target substrate such as a wafer W placed on a susceptor 1602 is cleaned by a chemical reaction. In FIG. 17, the upper electrode 1603 that produces plasma is disposed in the processing chamber 1601. Alternatively, a coil may be disposed outside the processing chamber 1601. An exciting and activating seed (a radical) may be supplied from the outside of the processing chamber. Alternatively, with a lower electrode, an exciting and activating seed may be attracted to a target substrate. Alternatively, a lower electrode may not be disposed so as to alleviate a damage of the target substrate. The numeral 1606 is a gate valve for loading and unloading the wafer W.

Figure 18:
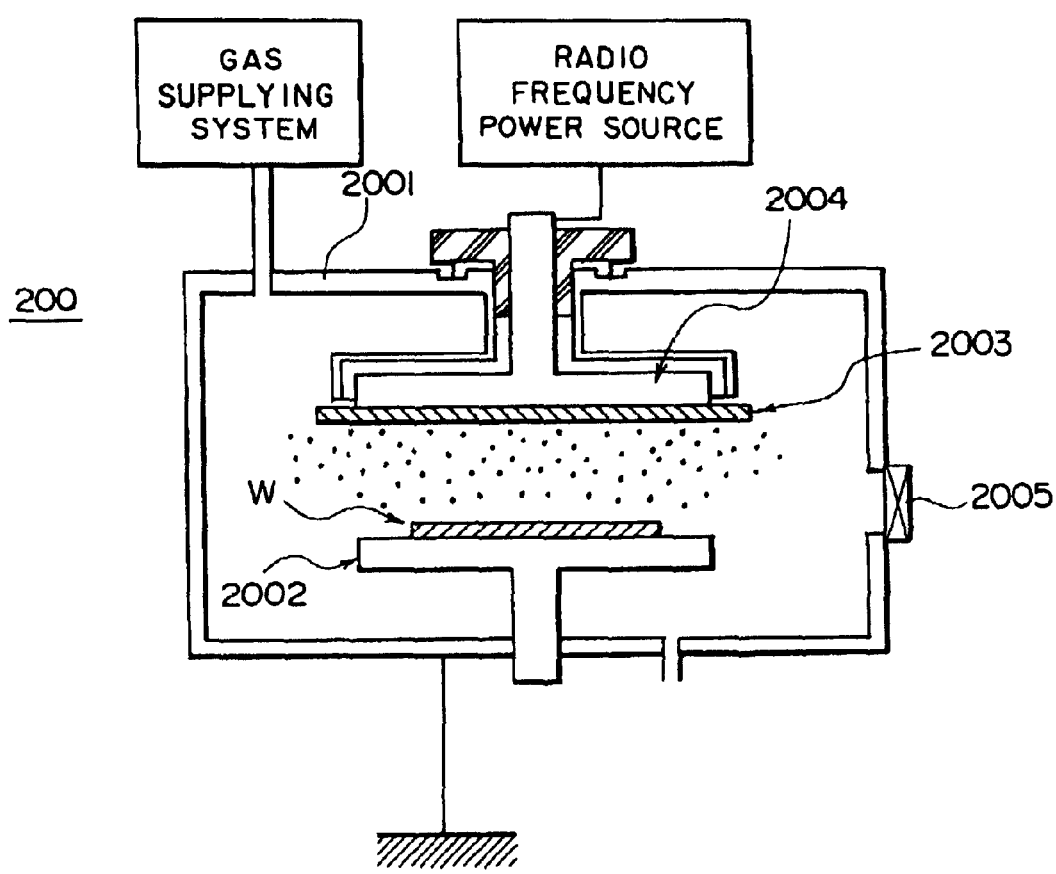
FIG. 18 is a vertical sectional view showing a spattering unit of the processing apparatus according to the second embodiment of the present invention.

FIG. 18 is a vertical sectional view showing the spattering unit 200 according to the second embodiment of the present invention. As shown in FIG. 18, a processing chamber 2001 of the spattering unit 200 is air-tightly structured. With a discharging gas supplied to the processing chamber 2001, the interior thereof can be maintained in a high vacuum environment.

A substrate holder 2002 is disposed at a center bottom portion of the processing chamber 2001. A wafer W is placed on the substrate holder 2002. On the substrate holder 2002, the wafer W is processed. A target 2003 is held through an electrode 2004 so that the target 2003 faces the substrate holder 2002. A discharging gas is excited at a voltage applied by the electrode 2004 under a high vacuum environment. Excited positive ions collide with the front surface of the target. The target 2003 gives off atoms. The atoms deposit on the front surface of the wafer W. As a result, a layer of a desired material is formed on the front surface of the wafer W. The numeral 2005 is a gate valve for loading and unloading the wafer W.

According to the second embodiment of the present invention, the spattering units 200 and 210 that deposit a tantalum (Ta) layer using tantalum (Ta) as a target and the spattering units 220 and 230 that deposit a copper (Cu) layer using copper (Cu) as a target are disposed as the second processing units.

Figure 19:
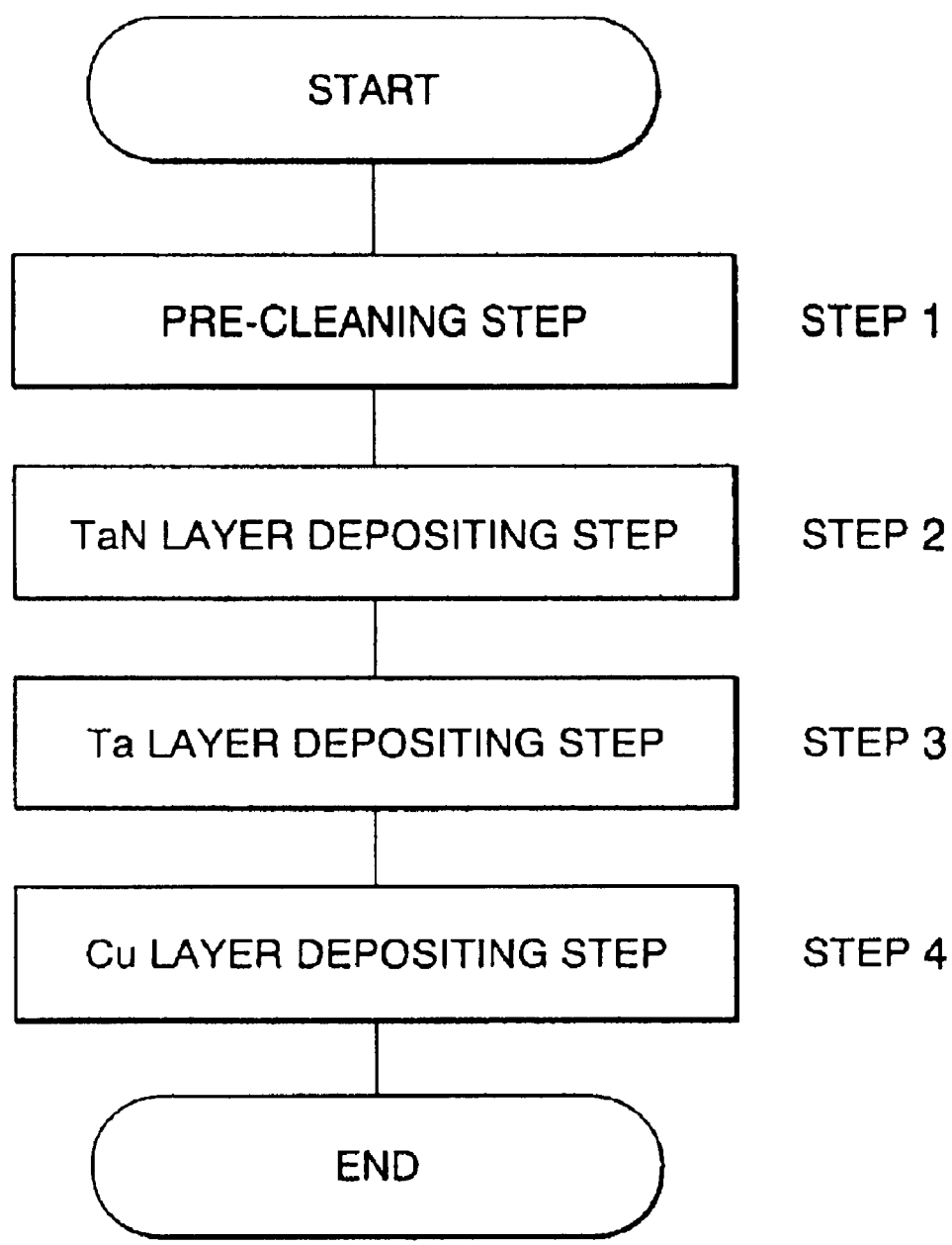
FIG. 19 is a flow chart for which the processing apparatus according to the second embodiment of the present invention fabricates a semiconductor device.

Next, steps for which the processing apparatus 2 according to the second embodiment of the present invention fabricates a semiconductor device will be explained. FIG. 19 is a flow chart for which the processing apparatus 2 according to the second embodiment of the present invention fabricates a semiconductor device. FIGS. 20A, 20B, 20C, 20D, and 20E are vertical sectional views showing states of a semiconductor device which is being fabricated by the processing apparatus 2.

First of all, a carrier cassette C that contains a plurality of untreated wafers W is placed on the substrate container holding table 10. Thereafter, the processing apparatus 2 is activated. The sub arm 21 is operated to access the carrier cassette C, take out a untreated wafer W therefrom, and load the wafer W to the first load lock chamber 20. Thereafter, a gate value (not shown) disposed on the holding table side is closed in the first load lock chamber 20. Thereafter, the inner pressure of the first load lock chamber 20 is lowered so that the inner pressure nearly becomes the same as the inner pressure of the first transferring chamber 30. Thereafter, a gate valve disposed on the transferring chamber side is opened in the first load lock chamber 20.

Figure 20A:
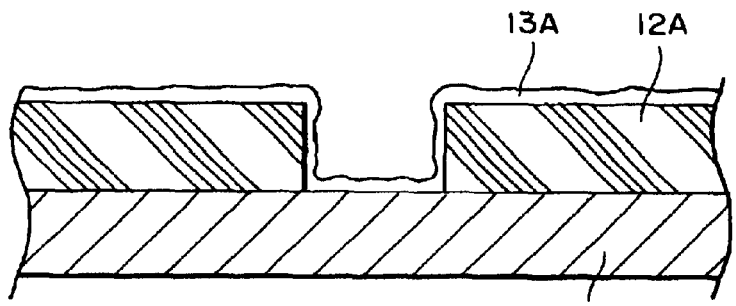
FIGS. 20A, 20B, 20C, 20D, and 20E are vertical sectional views showing a semiconductor device fabricated by the processing apparatus according to the second embodiment of the present invention.

The transferring arm 31 is operated to access the first load lock chamber 20, take out the wafer W therefrom, and load it to the pre-cleaning unit (reactive clean unit) 160. As shown in FIG. 20A, a wafer W that has not been pre-cleaned is composed of a copper (Cu) base wiring layer 11A and an insulation layer 12A formed on the upper surface thereof. On the insulation layer 12A, for example an $SiO_2$ layer has been formed in a predetermined pattern shape. The entire surface of the wafer W on which the insulation layer 12A is formed is coated with a natural oxide film 13A.

Figure 20B:
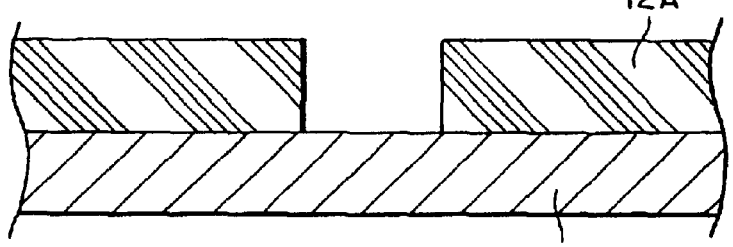

The gate value 1606 of the pre-cleaning unit 160 is air-tightly closed. After a predetermined pressure and a predetermined temperature have been obtained, a cleaning gas is supplied. The cleaning gas that has been excited and activated by a radio frequency power source or the like is chemically reacted with a natural oxide film 13A on the front surface of the wafer W. As shown in FIG. 20B, the natural oxide film 13A that coats the entire front surface of the wafer W is removed (at step 1). Alternatively, when a spatter etching process is performed, a predetermined pressure and a predetermined temperature are maintained. As a result, a process gas in the pre-cleaning unit 160 collides with the front surface of the wafer W placed on the susceptor. Consequently, the front surface of the wafer W is cleaned. At that point, molecules of the process gas collide with the front surface of the wafer W. As shown in FIG. 20B, the natural oxide film 13A that coats the entire surface of the wafer W is removed.

Thereafter, the supply of the cleaning gas to the pre-cleaning unit 160 is stopped. The gate value 1606 of the pre-cleaning unit 160 is opened. The transferring arm 31 is operated to access the pre-cleaning unit 160, take out the wafer W therefrom, transfer the wafer W to the first transferring arm 32 disposed on the far side. At that point, the wafer W may be directly transferred from the transferring arm 31 to the first transferring arm 32. Alternatively, the wafer w may be transferred from the transferring arm 31 to the first transferring arm 32 through at least one transferring portion (relaying table) disposed in the first transferring chamber 30.

Figure 20C:
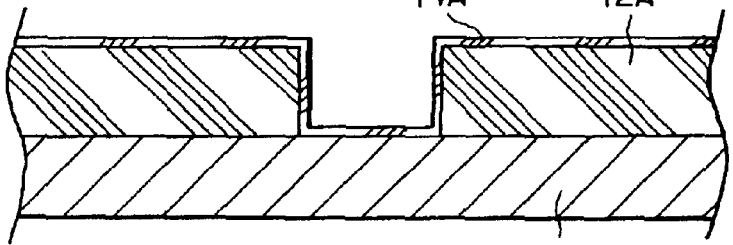
Figure 20D:
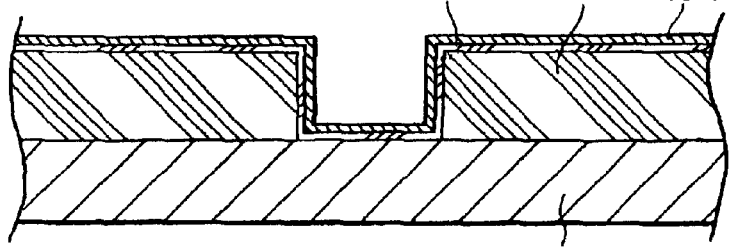

Thereafter, the first transferring arm 32 is operated to access the CVD unit or ALD unit 180 on the far side of the pre-cleaning unit 160 and place the wafer W on the susceptor. Thereafter, the gate valve of the CVD unit or the ALD unit is closed. Under predetermined conditions, a process gas is supplied. A predetermined material layer (a tantalum nitride (TaN) layer 14A according to the second embodiment) is deposited on the front surface of the wafer W (at step 2). At step 2, as shown in FIG. 20C, the tantalum nitride (TaN) layer 14A is deposited on the front surface of the wafer W.

Thereafter, the gate value of the CVD unit or the ALD unit is opened. The first transferring arm 32 is operated to access the CVD unit or the ALD unit 180 and take out the wafer W, on which the tantalum nitride (TaN) layer 14A has been deposited, therefrom. Thereafter, a gate value (not shown) disposed on the first transferring chamber side is opened in the second load lock chamber 40. The wafer W is placed in the second load lock chamber 40. In this state, the gate value disposed on the first transferring chamber side is air-tightly closed in the second load lock chamber 40. Thereafter, the inner pressure of the second load lock chamber 40 is lowered so that the inner pressure nearly becomes the same as the inner pressure of the second transferring chamber 50.

Thereafter, the gate value disposed on the second transferring chamber side is opened in the second load lock chamber 40. The transferring arm 41 is operated to access the second load lock chamber 40, take out the wafer W therefrom, and load it to the spattering unit 200 that deposits a tantalum (Ta) layer. In the state, the gate value 2005 of the spattering unit 200 is air-tightly closed. Under predetermined temperature and pressure conditions, a tantalum (Ta) layer 15A is deposited on the front surface of the wafer W (at step 3). At that point, the tantalum (Ta) layer 15A is deposited on the front surface of the tantalum nitride (TaN) layer 14A of the wafer w (see FIG. 20D). As a result, the adhesiveness and wetness of a seed layer 16A for a copper layer that is a wiring layer that will be deposited next are improved.

After the predetermined tantalum (Ta) layer 15A has been deposited, the supplies of the process gas and the voltage are stopped. The gate valve 2005 of the spattering unit 200 is opened. The transferring arm 41 is operated to access the spattering unit 200, take out the wafer W therefrom, and load it to the spattering unit 220 that is disposed on the far side and that deposits a copper (Cu) layer.

Figure 20E:
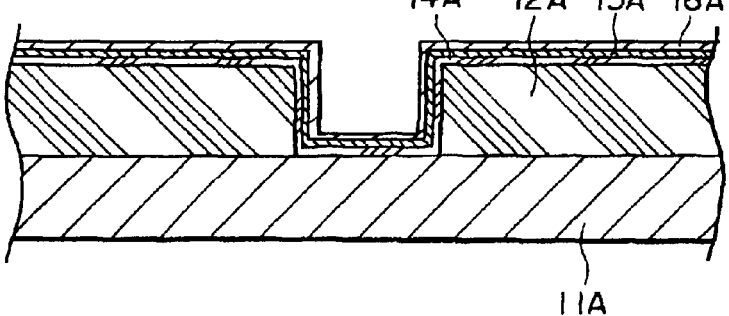

When the process gas and voltage are supplied under predetermined conditions in the same manner as those of the spattering unit 200, copper is deposited on the tantalum (Ta) layer 15A as the top layer of the wafer W. As shown in FIG. 20E, a copper (Cu) layer 16A is deposited as a seed layer on the front surface of the wafer W (at step 4). After the step that the natural oxide film 13A is removed to the step the copper (Cu) layer 16A is deposited have been completed, the wafer W is returned to the carrier cassette C through the second transferring arm 41, the second load lock chamber 40, the first transferring chamber 30, the first transferring arm 32, the transferring arm 31, and the first load lock chamber 20.

In the processing apparatus 2 according to the second embodiment of the present invention, since processing unit groups whose process pressures are different are connected through a load lock chamber, a wafer W can be successively processed, without being exposed to outer air, from a film depositing process performed in a low vacuum environment to a film depositing process performed in a high vacuum environment. Thus, the process speed can be increased and the fabrication cost can be reduced.

In addition, since it is not necessary to take out a wafer W that is being processed from the processing apparatus 2, a film can be deposited in a high quality without oxidation and deterioration thereof.

Third Embodiment

Figure 21:
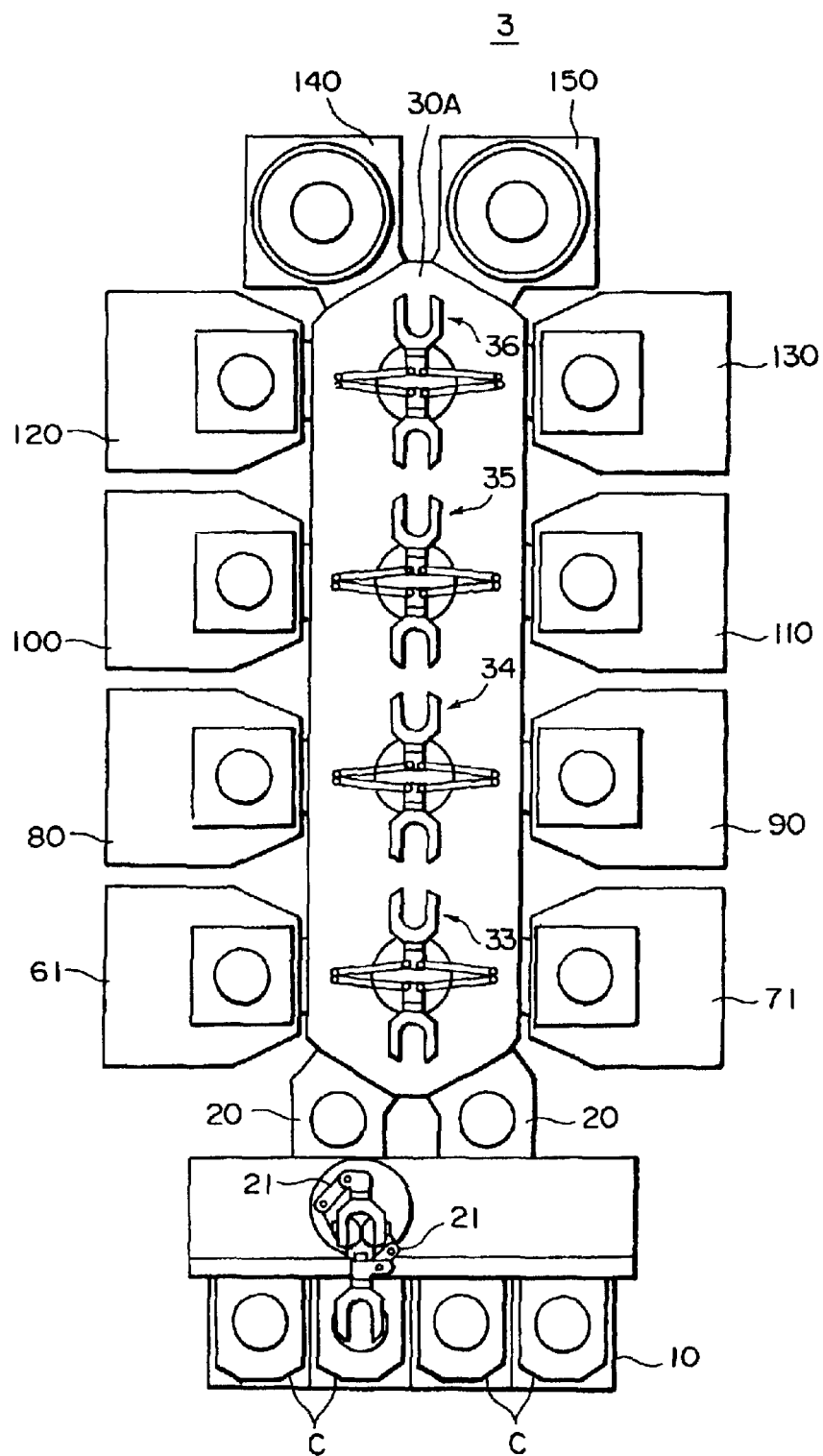
FIG. 21 is a plan view showing a processing apparatus according to a third embodiment of the present invention.

FIG. 21 is a plan view showing an outlined structure of a processing apparatus 3 according to a third embodiment of the present invention. According to the third embodiment, reactive ion etching units 61 and 71 are used instead of supercritical cleaning units used as the pre-cleaning units 60 and 70 of the processing apparatus 1 according to the first embodiment of the present invention. The reactive ion etching units 61 and 71 clean a wafer with a process gas. The reactive ion etching units 61 and 71 are disposed around a transferring chamber 30A together with CVD units 80, 90, 140, and 150 and ALD units 100, 110, 120, and 130 that are used in the next process.

Since the reactive ion etching units 61 and 71 are used in a reduced pressure environment, such units can be laid out. In the processing apparatus according to the third embodiment of the present invention, since many processing units are disposed around the transferring chamber 30A, the processing apparatus having a higher area efficiency can be accomplished.

Fourth Embodiment

Figure 22:
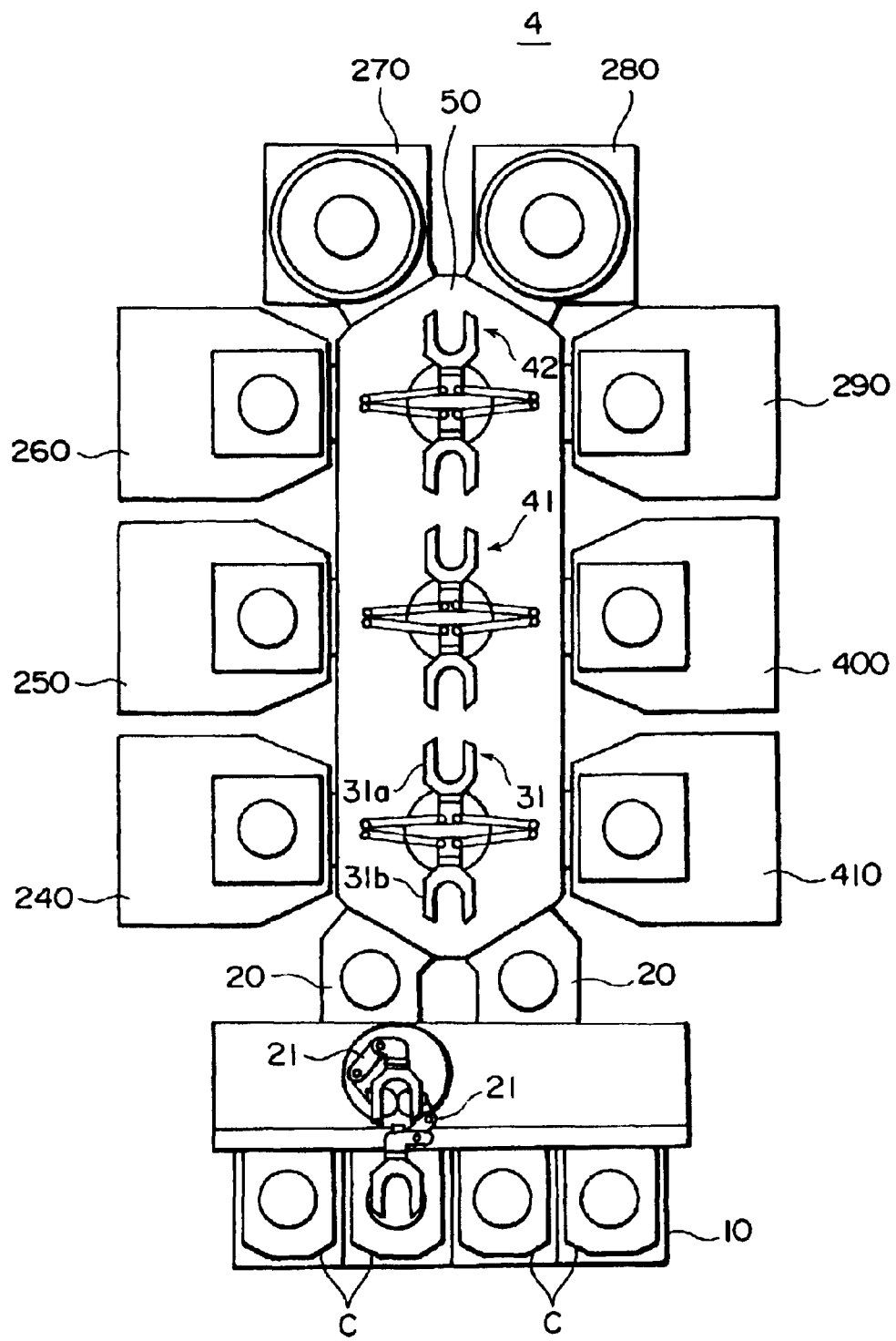
FIG. 22 is a plan view showing a processing apparatus according to a fourth embodiment of the present invention.
Figure 23:
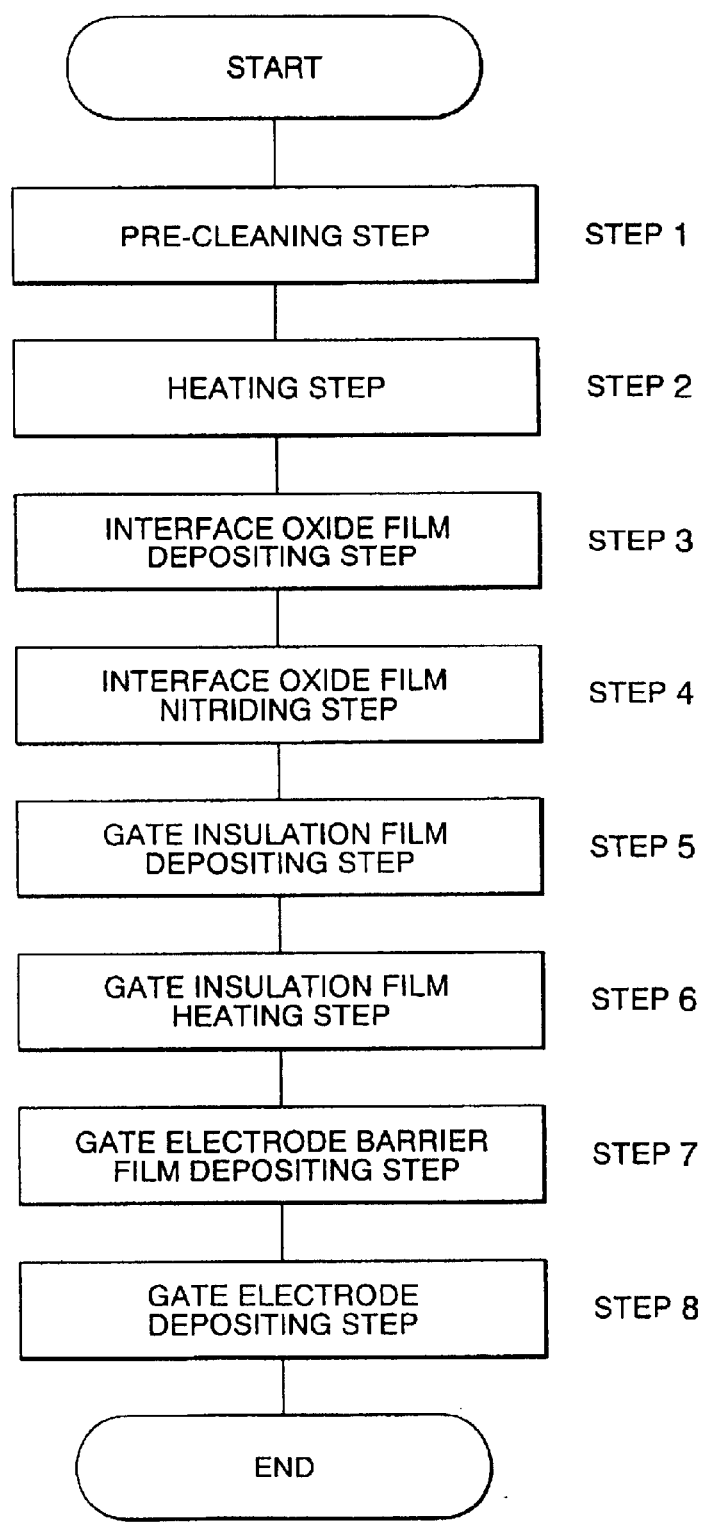
FIG. 23 is a flow chart showing a process for which the processing apparatus according to the fourth embodiment of the present invention is operated.

FIG. 22 is a plan view showing an outlined structure of a processing apparatus 4 according to a fourth embodiment of the present invention. In the processing apparatus 4 according to the fourth embodiment of the present invention, the forgoing processing units are combined so that steps shown in a flow chart of FIG. 23 are successively performed. FIGS. 24A, 24B, 24C, 24D, 24E, 24F, 25A, and 25B are vertical sectional views showing states of a wafer W at steps of the flow chart shown in FIG. 23.

Figure 24A:
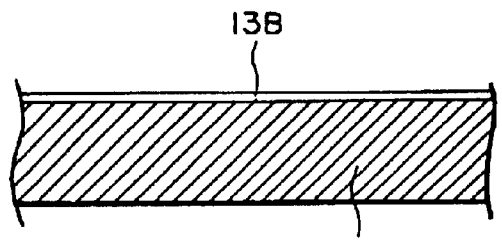
FIGS. 24A, 24B, 24C, 24D, 24E, and 24F are vertical sectional views showing a semiconductor device fabricated by the processing apparatus according to the fourth embodiment of the present invention.
Figure 24B:
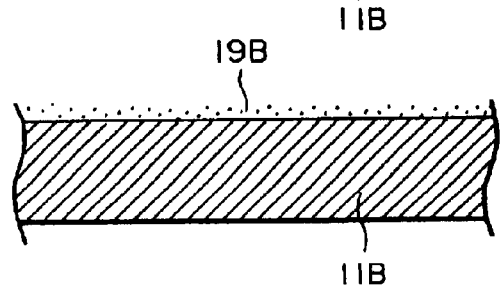
Figure 24C:
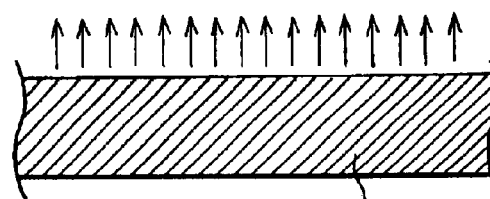
Figure 24D:
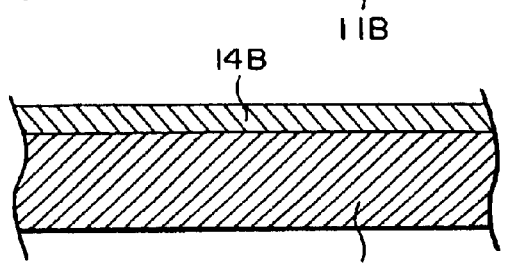
Figure 24E:
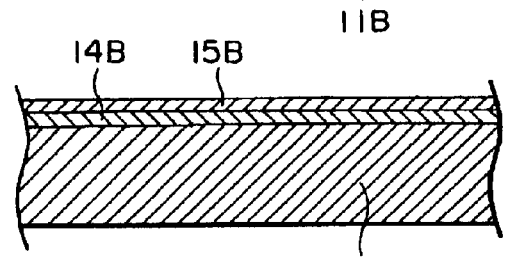
Figure 24F:
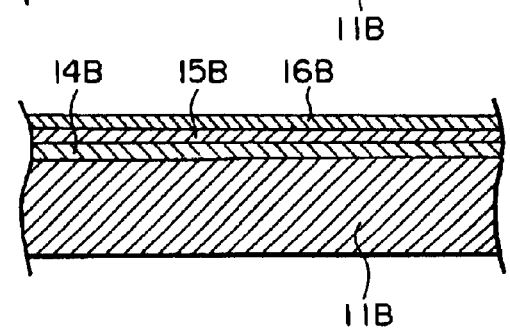
Figure 25A:
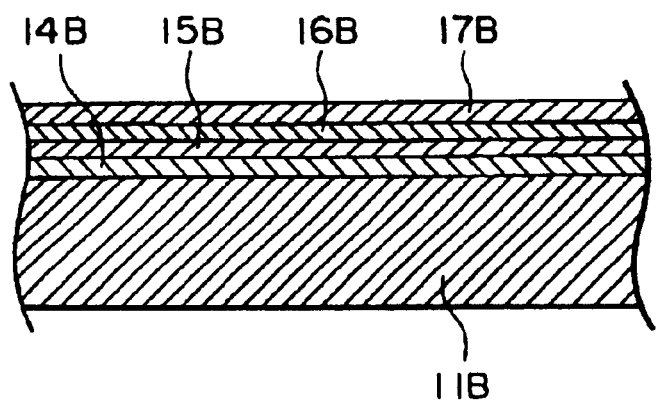
FIGS. 25A and 25B are vertical sectional views, which succeed FIG. 24F, showing a semiconductor device fabricated by the processing apparatus according to the fourth embodiment of the present invention.
Figure 25B:
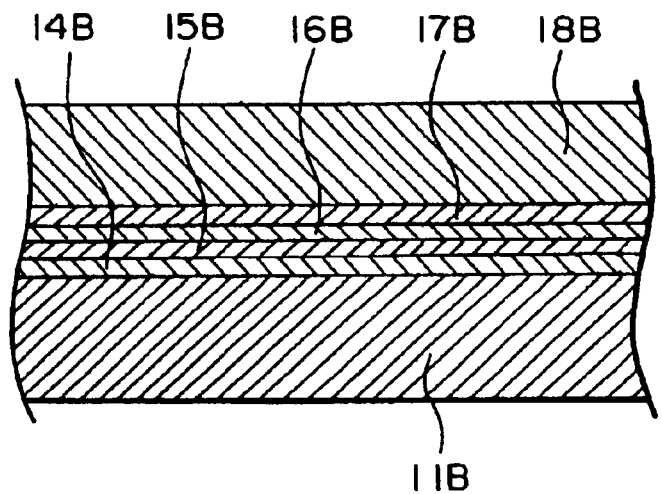

When the process is performed by the processing apparatus according to the fourth embodiment of the present invention, a untreated wafer W is loaded to the pre-cleaning unit 240. In this state, as shown in FIG. 24A, a natural oxide film 13B has been formed on the front surface of the wafer W. When a pre-cleaning process is performed in the pre-cleaning unit 240 (at step 1), the natural oxide film 13B is removed from the front surface of the wafer W as shown in FIG. 24B.

Thereafter, the wafer W is loaded to an annealing unit 250 (at step 2). The annealing unit 250 performs an annealing step for the wafer W as a heating step proceeded by the pre-cleaning step. At the heating step, a residue 19B such as fluoride is removed (see FIG. 24C). Thereafter, the wafer W that has been annealed is unloaded from the annealing unit 250 and then loaded to an interface oxide film forming unit 260. In the interface oxide film forming unit 260, an interface oxide film 14B is formed (at step 3, FIG. 24D). The interface oxide film 14B allows the electric characteristic of the interface of the wafer W to be improved.

Thereafter, the wafer W on which the interface oxide film 14B has been formed is unloaded from the interface oxide film forming unit 260 and then loaded to a nitride film forming unit 270. In the nitride film forming unit 270, the front surface of the interface oxide film 14B is nitrided. As a result, a nitride film 15B is formed on the front surface of the wafer W (at step 4, FIG. 24E). The nitride film 15B is a barrier layer formed between upper and lower layers. Thereafter, the wafer W on which the nitride film 15B has been formed is unloaded from the nitride film forming unit 270 and then loaded to a gate insulation film depositing unit 280.

Examples of the gate insulation film depositing unit 280 are an alumina layer depositing unit, a zirconium oxide layer depositing unit, zirconium silicate layer depositing unit, a hafnium oxide layer depositing unit, a hafnium silicate layer depositing unit, an yttrium oxide layer depositing unit, an yttrium silicate layer depositing unit, a lanthanum oxide layer depositing unit, and a lanthanum silicate layer depositing unit. In the gate insulation film depositing unit 280, a gate insulation film 16B is deposited on the front surface of the nitride film 15B of the wafer W (at step 5, FIG. 24F).

After the gate insulation film 16B has been deposited, the wafer W is unloaded from the gate insulation film depositing unit 280 and then loaded to an annealing unit 290. In the annealing unit 290, a heating step is performed for the gate insulation film 16B (at step 6). At the heating step for the gate insulation film 16B, the gate insulation film 16B is reformed.

After the heating step for the gate insulation film 16B has been completed, the wafer W is unloaded from the annealing unit 290 and then loaded to a gate electrode barrier film depositing unit 400. The gate electrode barrier film servers as a barrier for the gate insulation film 16B and a gate electrode that will be formed at the next step. Examples of the barrier film depositing unit 400 are a manganese film depositing unit, a niobium layer depositing unit, an aluminum layer depositing unit, a molybdenum layer depositing unit, a zirconium layer depositing unit, a vanadium layer depositing unit, a cobalt layer depositing unit, a rhenium layer depositing unit, an iridium layer depositing unit, a platinum layer depositing unit, and a ruthenium oxide layer depositing unit. In the gate electrode barrier film depositing unit 400, a gate electrode barrier film 17B is deposited (at step 7, FIG. 25A).

After the gate electrode barrier film 17B has been deposited, the resultant wafer W is unloaded from the gate electrode barrier film depositing unit 400 and then loaded to a gate electrode depositing unit 410. In the gate electrode depositing unit 410, a gate electrode 18B is deposited (at step 8, FIG. 25B). The gate electrode depositing unit 410 is a unit that deposits a gate electrode. An example of the gate electrode depositing unit 410 is a tungsten layer depositing unit or an aluminum layer depositing unit. After the forgoing steps have been completed, the resultant wafer W is unloaded from the processing apparatus 4.

In the processing apparatus 4 according to the fourth embodiment of the present invention, since the forgoing eight steps can be successively performed without an exposure to outer air, films that are being deposited are prevented from being oxidized and deteriorated. As a result, films can be deposited in high quality. In addition, since many processing units are disposed around one transferring chamber, a processing apparatus having a higher area efficiency can be provided.

Fifth Embodiment

Figure 26A:
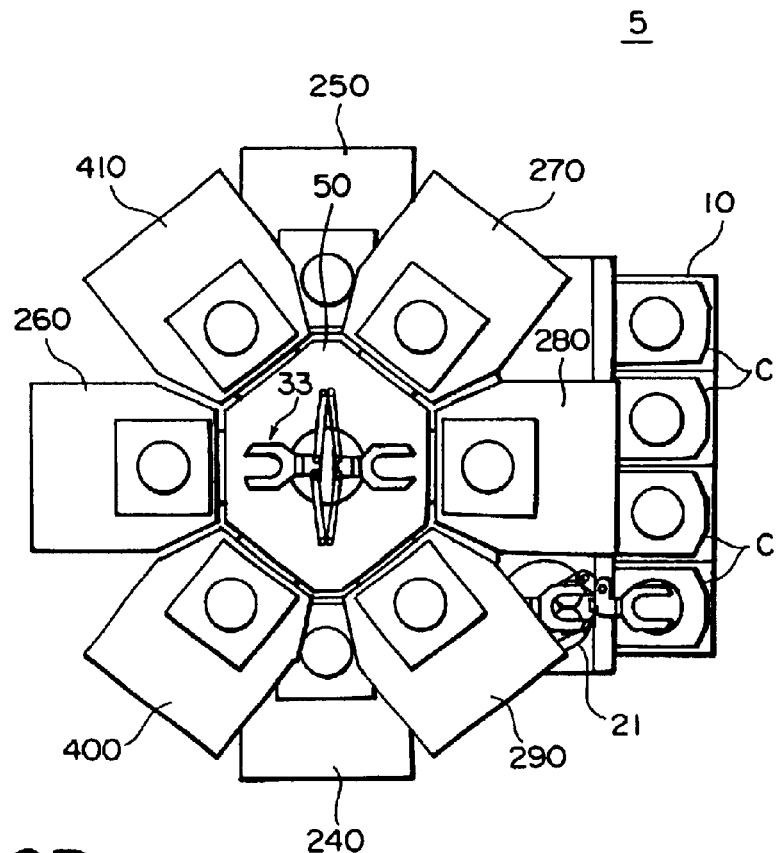
FIGS. 26A and 26B are plan views showing a processing apparatus according to a fifth embodiment of the present invention.
Figure 26B:
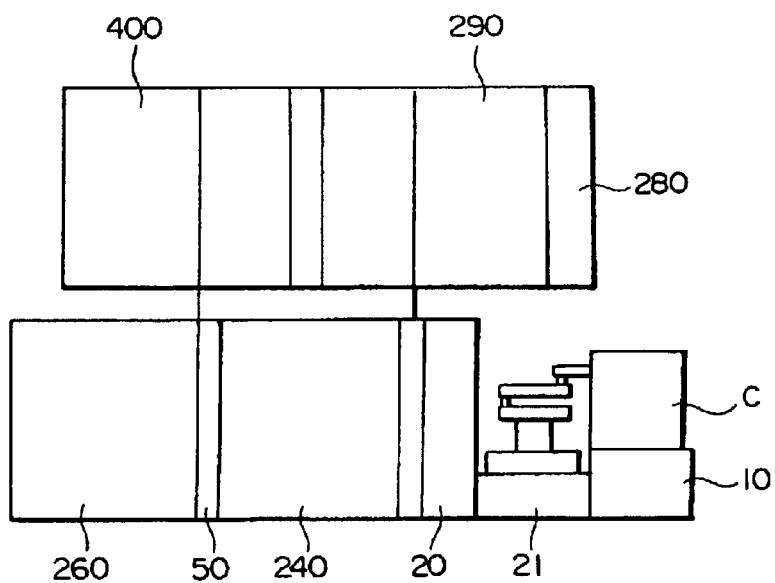

FIG. 26 is a schematic diagram showing an outlined structure of a processing apparatus 5 according to a fifth embodiment of the present invention. FIGS. 26A and 26B are a plan view and a side view of the processing apparatus 5, respectively. In the processing apparatus 5 according to the fifth embodiment of the present invention, the processing unit group disposed around the transferring chamber 50 of the processing apparatus 4 according to the fourth embodiment of the present invention is disposed as upper units and lower units. Thus, the transferring chamber 50 vertically extends. Correspondingly, a transferring arm 33 is structured so that it can be rotated, expanded, contracted, and largely moved in the vertical direction.

As lower units disposed around the transferring chamber 50, there are three units that are a pre-cleaning unit 240, an annealing unit 250, and an interface oxide film forming unit 260. As upper units disposed around the transferring chamber 50, there are five units that are a nitride film forming unit 270, a gate insulation film depositing unit 280, an annealing unit 290, a gate electrode barrier film depositing unit 400, and a gate electrode depositing unit 410.

In addition, the lower units and the upper units are laid out in such a manner that one upper unit is disposed between two adjacent lower units so as to prevent each lower unit from interfering with each upper unit. Thus, as an advantage, each lower unit can be easily maintained and inspected.

In the processing apparatus 5 according to the fifth embodiment of the present invention, since many processing units are disposed on two stages around one transferring chamber 50, the processing apparatus 5 has a higher area efficiency than the other structures. When units that have a relatively lower height (for example, ALD units) are disposed on the lower stage of the apparatus, the vertical moving range of the transferring arm 33 can be minimized. When each unit has a structure in which a maintenance work can be performed on other than the top, upper units and lower units can be straightly piled up.

Sixth Embodiment

Figure 27:
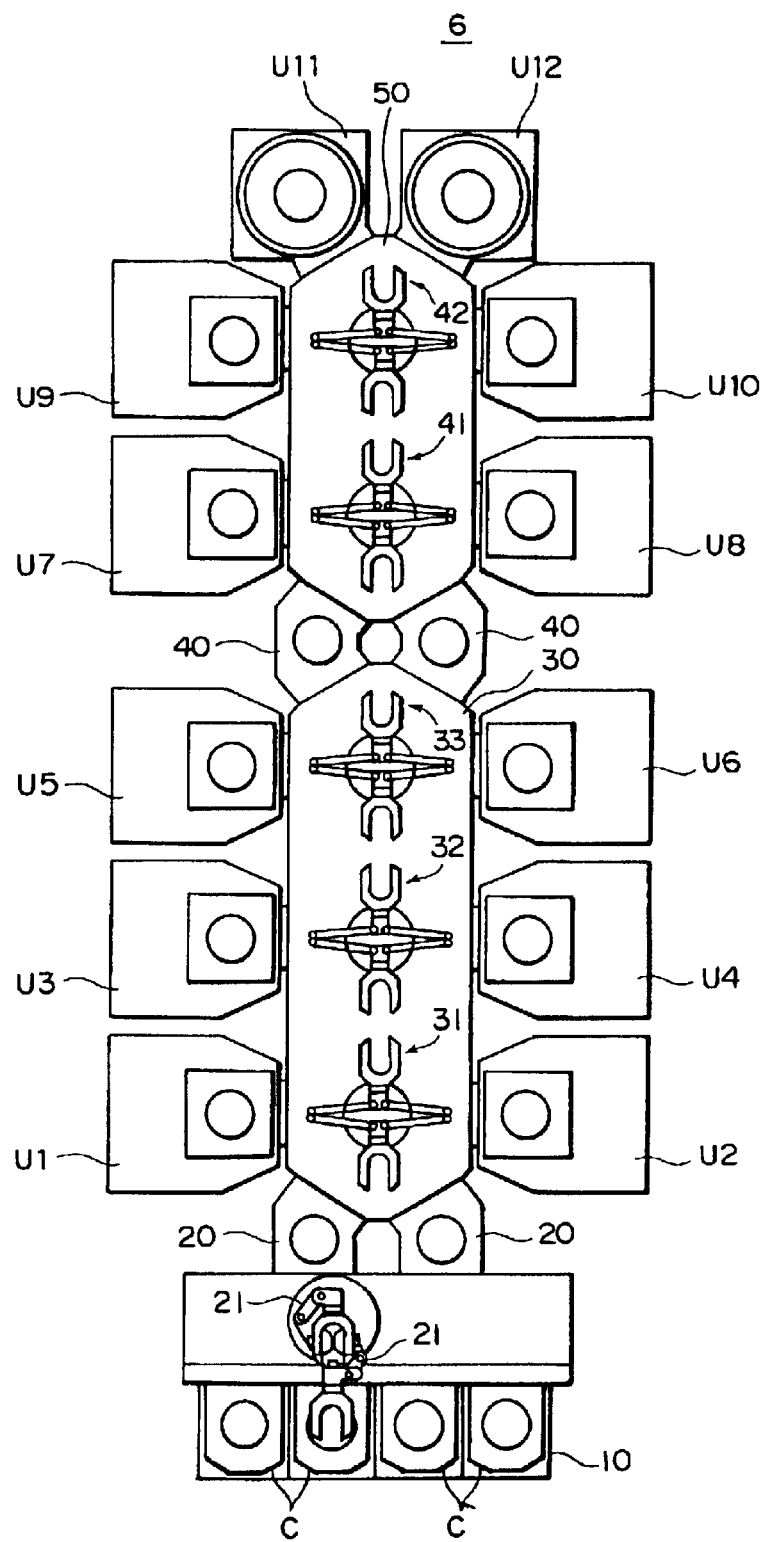
FIG. 27 is a plan view showing a processing apparatus according to a sixth embodiment of the present invention.
Figure 28:
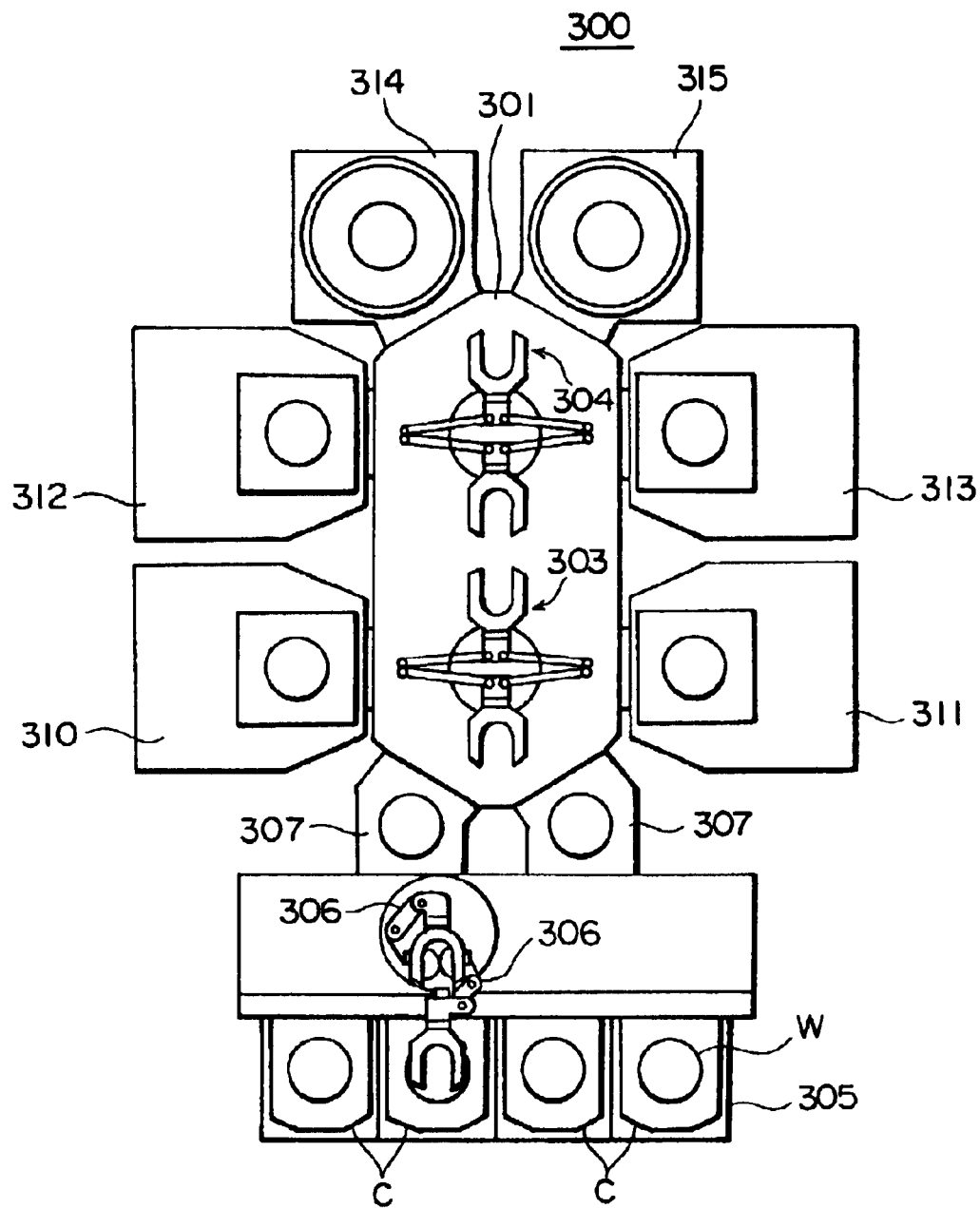
FIG. 28 is a plan view showing an existing six-chamber type processing apparatus.

FIG. 27 is a plan view showing a processing apparatus 6 according to a sixth embodiment of the present invention. In the processing apparatus 6 according to the sixth embodiment of the present invention, six processing units U1 to U6 are disposed around a first transferring chamber 30. In addition, six processing units U7 to U12 are disposed around a second transferring chamber 50. As a result, in the processing apparatus 5, 12 processing units U1 to U12 are disposed. Thus, in the processing apparatus 6 according to the sixth embodiment of the present invention, many processing units are disposed around one transferring chamber. As a result, the processing apparatus has a higher area efficiency than other structures. In addition, since a wafer W can be successively processed without an exposure to outer air. As a result, films that are being deposited can be prevented from being oxidized and deteriorated. Thus, films can be deposited in high quality.

The forgoing embodiments of the present invention present three fabrication processes for semiconductor devices with referent to the respective flow charts. When the processing apparatuses according to the forgoing embodiments of the present invention use for example an etching unit, an ashing unit, an ion doping unit, a heating unit, a cleaning unit, and a coating and developing unit other than the forgoing processing units, the present invention can be applied to other processes. In addition, the present invention can be applied for a fabricating method for an LCD other than a semiconductor device.

Although the present invention has been shown and described with respect to an embodiment thereof, it should be understood by those skilled in the art that the foregoing and various other changes, omissions, and additions in the form and detail thereof may be made therein without departing from the spirit and scope of the present invention.

What is claimed is:

1. A processing apparatus, comprising:
   a substrate container holding table configured to hold a substrate container that contains a plurality of target substrates;
   a first transferring chamber disposed adjacent to the substrate container holding table, said first transferring chamber being adapted to maintain an interior thereof at a first pressure;
   a first processing unit group disposed around the first transferring chamber, said first processing unit group being configured to process a target substrate at the first pressure;
   a first transferring mechanism disposed in the first transferring chamber, said first transferring mechanism being configured to transfer a target substrate;
   a second transferring chamber disposed adjacent to the first transferring chamber, said second transferring chamber being adapted to maintain an interior thereof at a second pressure;
   a second processing unit group disposed around the second transferring chamber, said second processing unit group being configured to process a target substrate at the second pressure;
   a second transferring mechanism disposed in the second transferring chamber;
   a first load lock chamber connecting the first transferring chamber and the substrate container holding table; and
   a second load lock chamber connecting the first transferring chamber and the second transferring chamber,
   wherein one or more of the first transferring mechanism or the second transferring mechanism has at least two transferring arms, and
   wherein one or more of the first load lock chamber or the second load lock chamber also functions as an inspecting module for a target substrate.

2. The processing apparatus as set forth in claim 1 wherein the first pressure is different from the second pressure.

3. The processing apparatus as set forth in claim 1, further comprising:
   a target substrate unloading portion disposed around the second transferring chamber, said target substrate unloading portion being configured to directly unload a target substrate that has been processed.

4. The processing apparatus as set forth in claim 1, wherein the transferring arm has a frog leg shape.

5. The processing apparatus as set forth in claim 1, wherein at least one processing unit contained in the first processing unit group or the second processing unit group is an inspecting module for a target substrate.

6. A processing apparatus, comprising:
   a substrate container holding table configured to hold a substrate container that contains a plurality of target substrates;
   a transferring chamber disposed adjacent to the substrate container holding table, said transferring chamber being adapted to maintain an interior thereof at a predetermined pressure;
   a processing unit group disposed around the transferring chamber, said processing unit group being configured to process a target substrate at the predetermined pressure; and
   at least three transferring arms disposed in the transferring chamber, said at least three transferring arms being configured to transfer a target substrate,
   wherein at least one of the transferring arms can be expanded, contracted, and swiveled, and has a target substrate holding member that is asymmetrical regarding a directional line along which the transferring arm is expanded and contracted.

7. The processing apparatus as set forth in claim 6, wherein the transferring chamber has a plurality of target substrate relaying portions that can be accessed by at least two of the transferring arms.

8. The processing apparatus as set forth in claim 6, wherein at least one unit of the unit group is disposed in a vertical direction of another unit.

9. A processing apparatus, comprising:
   a substrate container holding table configure to hold a substrate container that contains a plurality of target substrates;
   a first transferring chamber disposed adjacent to the substrate container holding table, said first transferring chamber is adapted to maintain an interior thereof at a first pressure;
   a first processing unit group disposed around the first transferring chamber, said first processing unit group being configured to process a target substrate at the first pressure;
   a first transferring mechanism disposed in the first transferring chamber, said first transferring mechanism being configured to transfer a target substrate;
   a second transferring chamber disposed adjacent to the first transferring chamber, said second transferring chamber being adapted to maintain an interior thereof at a second pressure;
   a second processing unit group disposed around the second transferring chamber, said second processing unit group being configured to process a target substrate at the second pressure; and
   a second transferring mechanism disposed in the second transferring chamber,
   wherein one or more of the first transferring mechanism or the second transferring mechanism has at least two transferring arms, and
   wherein at least one processing unit contained in the first processing unit group or the second processing unit group comprises a susceptor having a tabletop on which a target substrate can be supported and a plurality of supporting pins protrusively disposed on the tabletop of the susceptor, the plurality of supporting pins being used for loading and unloading a target substrate, a center position of the supporting pins deviating from a center position of the susceptor.

10. A processing apparatus, comprising:

a substrate container holding table configured to hold a substrate container that contains a plurality of target substrates;

a first transferring chamber disposed adjacent to the substrate container holding table, said first transferring chamber is adapted to maintain an interior thereof at a first pressure;

a first processing unit group disposed around the first transferring chamber, said first processing unit group being configured to process a target substrate at the first pressure;

a first transferring mechanism disposed in the first transferring chamber, said first transferring mechanism being configured to transfer a target substrate;

a second transferring chamber disposed adjacent to the first transferring chamber, said second transferring chamber being adapted to maintain an interior thereof at a second pressure;

a second processing unit group disposed around the second transferring chamber, said second processing unit group being configured to process a target substrate at the second pressure; and a second transferring mechanism disposed in the second transferring chamber, wherein one or more of the first transferring mechanism or the second transferring mechanism has at least two transferring arms, wherein at least one of the transferring arms can be expanded, contracted, and swiveled, and wherein a center of the swiveling of at least one of the transferring arms deviates from a front surface of the processing unit that is contained in one of the first processing unit group and the second processing unit group and that is closer to the at least one of transferring arms.

11. A processing apparatus, comprising:

a substrate container holding table configured to hold a substrate container that contains a plurality of target substrates;

a first transferring chamber disposed adjacent to the substrate container holding table, said first transferring chamber is adapted to maintain an interior thereof at a first pressure;

a first processing unit group disposed around the first transferring chamber, said first processing unit group being configured to process a target substrate at the first pressure;

a first transferring mechanism disposed in the first transferring chamber, said first transferring mechanism being configured to transfer a target substrate;

a second transferring chamber disposed adjacent to the first transferring chamber, said second transferring chamber being adapted to maintain an interior thereof at a second pressure;

a second processing unit group disposed around the second transferring chamber, said second processing unit group being configured to process a target substrate at the second pressure; and a second transferring mechanism disposed in the second transferring chamber, wherein one or more of the first transferring mechanism or the second transferring mechanism has at least two transferring arms, and wherein at least one of the transferring arms can be expanded, contracted, and swiveled, and has a substrate holding member that is asymmetrical with regard to a directional line along which the at least one of the transferring arms is expanded and contracted.

12. The processing apparatus as set forth in claim 11, further comprising:

a target substrate unloading portion disposed around the second transferring chamber, said target substrate unloading portion being configured to directly unload a target substrate that has been processed.

13. The processing apparatus as set forth in claim 11, wherein at least one of the transferring arms has a frog leg shape.

14. The processing apparatus as set forth in claim 11, further comprising:

a first load lock chamber that connects the first transferring chamber and the substrate container holding table; and a second load lock chamber that connects the first transferring chamber and the second transferring chamber.

15. The processing apparatus as set forth in claim 11, wherein at least one processing unit contained in the first processing unit group or the second processing unit group is an inspecting module for a target substrate.

16. The processing apparatus as set forth in claim 11, wherein at least one processing unit contained in the first processing unit group or the second processing unit group comprises a susceptor having a tabletop on which a target substrate can be supported and a plurality of supporting pins protrusively disposed on the tabletop of the susceptor, the plurality of supporting pins being used for loading and unloading a target substrate, and positioned on the tabletop in such a manner that the supporting pins do not interfere with the asymmetrical target substrate holding member of the transferring arm.

17. The processing apparatus as set forth in claim 16, wherein a center position of the plurality of supporting pins deviates from a center position of the susceptor.

18. The processing apparatus as set forth in claim 11, wherein shapes of the target substrate holding members of the transferring arms are nearly the same to each other.

* * * * *